(12) United States Patent
Ikeda et al.

(10) Patent No.: US 12,009,360 B2
(45) Date of Patent: Jun. 11, 2024

(54) SEMICONDUCTOR DEVICE AND METHOD FOR MANUFACTURING THE SAME

(71) Applicant: Mitsubishi Electric Corporation, Tokyo (JP)

(72) Inventors: Munenori Ikeda, Tokyo (JP); Tetsuya Nitta, Tokyo (JP); Kenji Harada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 88 days.

(21) Appl. No.: 17/454,415

(22) Filed: Nov. 10, 2021

(65) Prior Publication Data

US 2022/0238513 A1 Jul. 28, 2022

(30) Foreign Application Priority Data

Jan. 26, 2021 (JP) .................................. 2021-010534

(51) Int. Cl.
*H01L 27/06* (2006.01)
*H01L 21/225* (2006.01)
(Continued)

(52) U.S. Cl.
CPC ...... *H01L 27/0664* (2013.01); *H01L 21/2253* (2013.01); *H01L 21/26513* (2013.01);
(Continued)

(58) Field of Classification Search
None
See application file for complete search history.

(56) References Cited

U.S. PATENT DOCUMENTS 10,770,453 B2    9/2020   Onozawa et al.
2008/0048295 A1*  2/2008  Takahashi ........... H01L 29/7397
                                                      257/E21.384
(Continued)

FOREIGN PATENT DOCUMENTS

JP    2012-043890 A    3/2012
JP    2018-182279 A   11/2018
(Continued)

OTHER PUBLICATIONS

An Office Action mailed by the Japanese Patent Office dated Dec. 12, 2023, which corresponds to Japanese Application No. 2021-010534 with English translation.

*Primary Examiner* — Erik T. K. Peterson
*Assistant Examiner* — Christopher A. Schodde
(74) *Attorney, Agent, or Firm* — Studebaker & Brackett PC

(57) ABSTRACT

An IGBT region includes: an n-type carrier accumulation layer provided to be in contact with the $n^-$-type drift layer on the first main surface side of the $n^-$-type drift layer and having a higher n-type impurity concentration than the $n^-$-type drift layer, a p-type base layer provided between the n-type carrier accumulation layer and the first main surface, an $n^+$-type emitter layer selectively provided in a surface layer portion of the p-type base layer, and a gate electrode provided to face the $n^+$-type emitter layer and the p-type base layer with an interposition of an insulating film. A diode region includes a p-type anode layer provided between the $n^-$-type drift layer and the first main surface and provided to a position deeper from the first main surface than a boundary between the n-type carrier accumulation layer and the $n^-$-type drift layer.

9 Claims, 25 Drawing Sheets

(51) Int. Cl.
*H01L 21/265* (2006.01)
*H01L 21/266* (2006.01)
*H01L 27/07* (2006.01)
*H01L 29/06* (2006.01)
*H01L 29/08* (2006.01)
*H01L 29/10* (2006.01)
*H01L 29/66* (2006.01)
*H01L 29/739* (2006.01)
*H01L 29/861* (2006.01)

(52) U.S. Cl.
CPC ........ *H01L 21/266* (2013.01); *H01L 27/0727* (2013.01); *H01L 29/0696* (2013.01); *H01L 29/0834* (2013.01); *H01L 29/1095* (2013.01); *H01L 29/66136* (2013.01); *H01L 29/66348* (2013.01); *H01L 29/7397* (2013.01); *H01L 29/8613* (2013.01)

(56) References Cited

U.S. PATENT DOCUMENTS

| | | | |
|---|---|---|---|
| 2016/0163696 A1* | 6/2016 | Takahashi | H01L 29/1095 257/140 |
| 2017/0025410 A1* | 1/2017 | Cheng | H01L 29/0834 |
| 2017/0117396 A1* | 4/2017 | Matsuura | H01L 29/7397 |
| 2018/0158815 A1 | 6/2018 | Onozawa et al. | |
| 2020/0388608 A1 | 12/2020 | Takano et al. | |
| 2021/0265491 A1* | 8/2021 | Soneda | H01L 29/0696 |

FOREIGN PATENT DOCUMENTS

| | | |
|---|---|---|
| JP | 6614326 B2 | 12/2019 |
| JP | 2020-202224 A | 12/2020 |
| WO | 2017/141998 A1 | 8/2017 |

* cited by examiner

C-C CROSS SECTION

D-D CROSS SECTION

G-G CROSS SECTION

G-G CROSS SECTION

E-E CROSS SECTION FIG. 11A
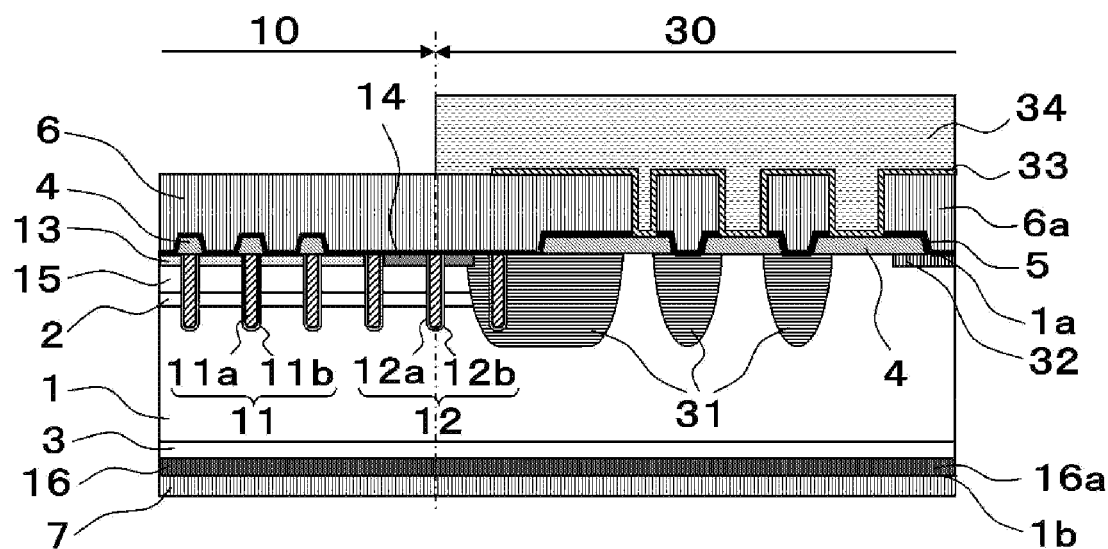
F-F CROSS SECTION FIG. 11B
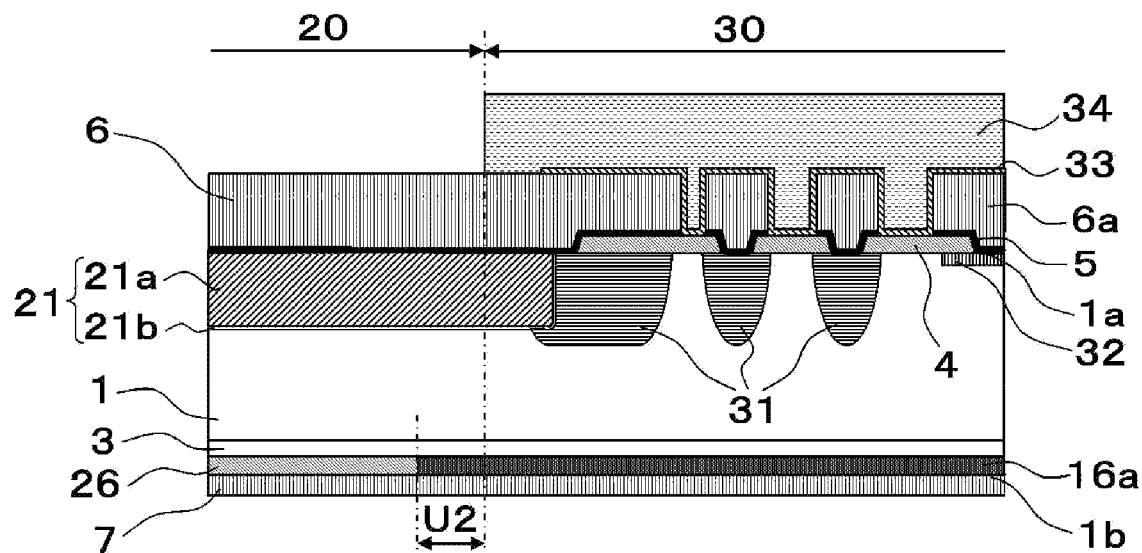

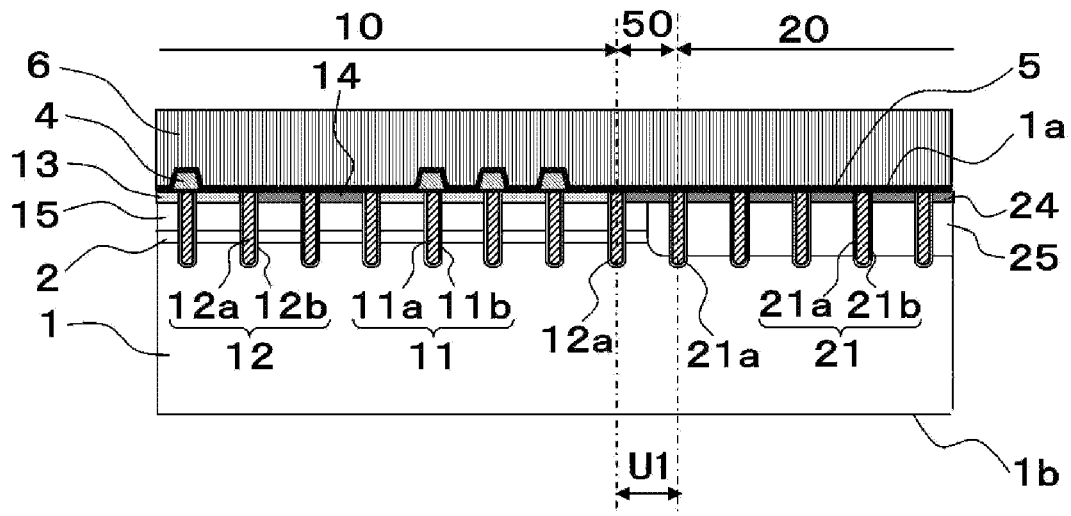
F I G. 1 8 A
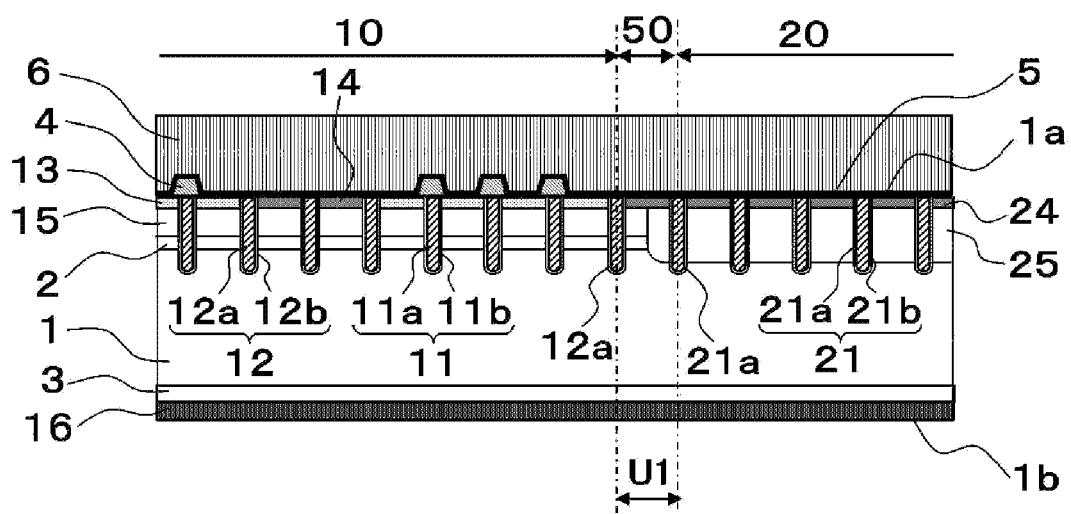
F I G. 1 8 B

K-K CROSS SECTION

G-G CROSS SECTION

SEMICONDUCTOR DEVICE AND METHOD FOR MANUFACTURING THE SAME

BACKGROUND OF THE INVENTION

Field of the Invention

The present disclosure relates to a semiconductor device and a method for manufacturing the semiconductor device.

Description of the Background Art

A reverse conducting insulated gate bipolar transistor (RC-IGBT) in which an IGBT region and a diode region are provided in one semiconductor device is known. In addition, a semiconductor device is known in which a carrier accumulation layer having a higher impurity concentration of the first conductivity type than the drift layer is provided between the drift layer of the first conductivity type and the base layer of the second conductivity type in the IGBT region.

In the conventional semiconductor device, the carrier accumulation layer is provided in the IGBT region rather than in the diode region, and the second carrier accumulation layer formed shallower than the first carrier accumulation layer being the carrier accumulation layer on the center side of the IGBT region is provided on the boundary side of the IGBT region with the diode region. Thus, in the conventional semiconductor device, the field plate effect at the boundary between the IGBT region and the diode region is easily obtained, and the withstand voltage is improved (see, for example, WO 2017/141998).

However, in the conventional semiconductor device, since the electric field acts to concentrate on the second carrier accumulation layer formed shallower than the first carrier accumulation layer, the electric field concentrates on part of the carrier accumulation layer, which causes a problem that the withstand voltage is lowered.

SUMMARY

The present disclosure has an object to provide a semiconductor device in which concentration of an electric field on a carrier accumulation layer is suppressed and a decrease in withstand voltage is suppressed, and a method for manufacturing the semiconductor device.

A semiconductor device according to the present disclosure includes: an IGBT region; and a diode region. The IGBT region and the diode region are included in a semiconductor substrate including a drift layer of a first conductivity type between a first main surface and a second main surface facing the first main surface. The IGBT region and the diode region are provided side by side in a first direction along the first main surface. The IGBT region includes: a collector layer of a second conductivity type provided between the drift layer and the second main surface, a carrier accumulation layer of a first conductivity type provided in contact with the drift layer on the first main surface side of the drift layer and having a higher impurity concentration of a first conductivity type than the drift layer, a base layer of a second conductivity type provided between the carrier accumulation layer and the first main surface, an emitter layer of a first conductivity type selectively provided in a surface layer portion of the base layer and having a part of the first main surface, and a gate electrode provided to face the emitter layer and the base layer with an interposition of an insulating film. The diode region includes: a cathode layer of a first conductivity type provided between the drift layer and the second main surface, and an anode layer of a second conductivity type provided between the drift layer and the first main surface and provided up to a position deeper from the first main surface than a boundary between the carrier accumulation layer and the drift layer.

According to the semiconductor device of the present disclosure, it is possible to provide a semiconductor device in which concentration of an electric field on a carrier accumulation layer is suppressed and a decrease in withstand voltage is suppressed.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 11A and 11B are cross-sectional views showing a configuration of a termination region of the semiconductor device according to the first preferred embodiment;

FIGS. 12A to 19B are diagrams each showing a method for manufacturing the semiconductor device according to the first preferred embodiment;

DESCRIPTION OF THE PREFERRED EMBODIMENTS

First Preferred Embodiment

Figure 1:
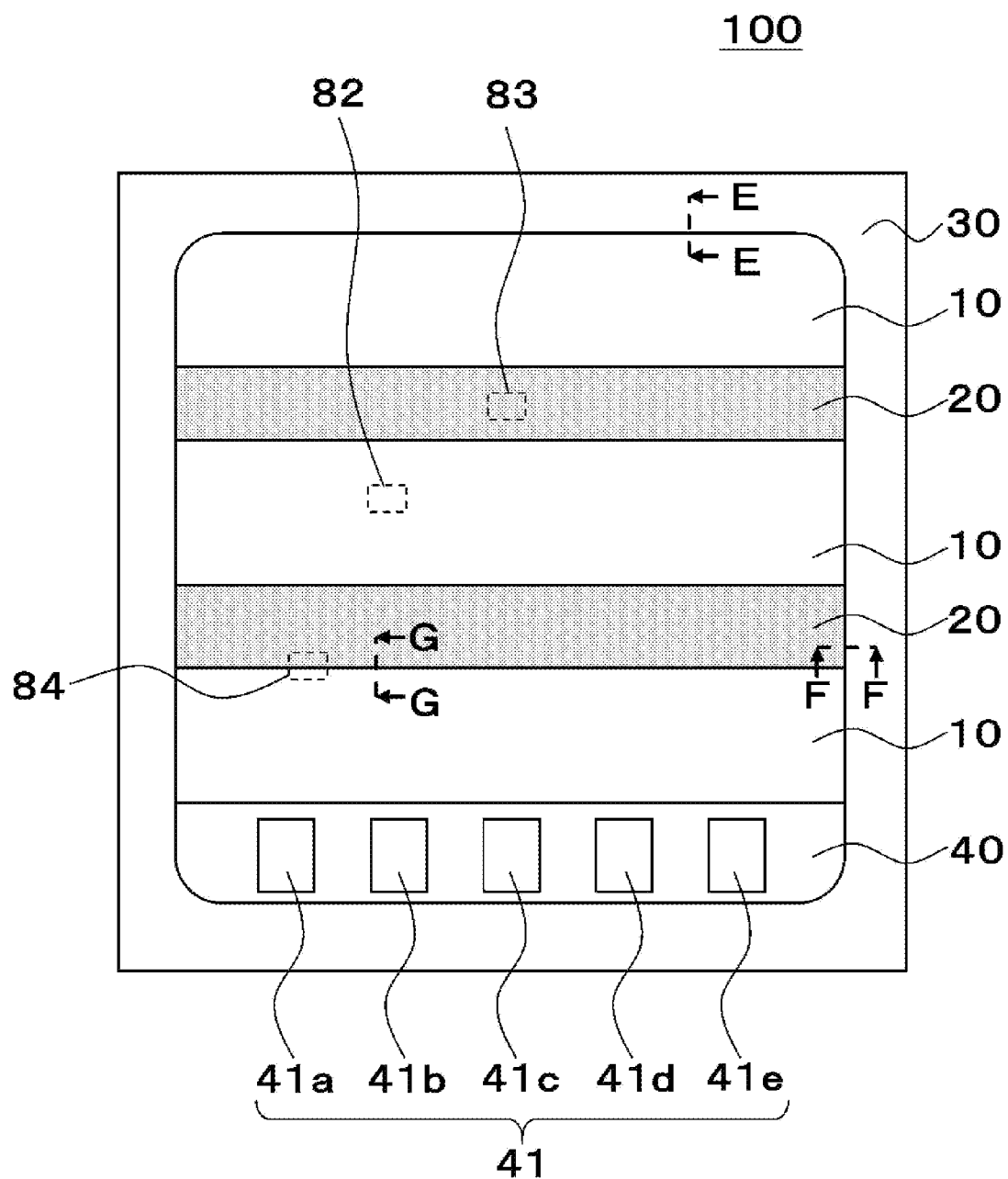
FIG. 1 is a plan view showing a semiconductor device according to a first preferred embodiment.

First, a configuration of a semiconductor device according to a first preferred embodiment will be described. FIG. 1 is a plan view showing a semiconductor device according to the first preferred embodiment.

In the following description, n and p represent the conductivity types of the semiconductor, and in the present invention, the first conductivity type is described as the n-type and the second conductivity type is described as the p-type. In addition, n⁻ indicates to have lower impurity concentration than n, and n⁺ indicates to have higher impurity concentration than n. Similarly, p⁻ indicates to have lower impurity concentration than p, and p⁺ indicates to have higher impurity concentration than p.

The semiconductor device 100 shown in FIG. 1 is an RC-IGBT in which IGBT regions 10 and diode regions 20 are provided side by side in a stripe shape, and may be simply referred to as a "stripe type" RC-IGBT.

In FIG. 1, the semiconductor device 100 includes IGBT regions 10 and diode regions 20 in one semiconductor device. The IGBT region 10 and the diode region 20 are provided side by side in a first direction (up-down direction on the paper surface) along the first main surface of the semiconductor substrate constituting the semiconductor device 100. The IGBT region 10 and the diode region 20 extend from one end side to the other end side of the semiconductor device 100, and are alternately provided in a stripe shape in a direction orthogonal to the extending direction of the IGBT region 10 and the diode region 20. In FIG. 1, three IGBT regions 10 and two diode regions are shown, and all the diode regions 20 are sandwiched between the IGBT regions 10. However, the number of the IGBT regions 10 and the diode regions 20 is not limited thereto, and the number of the IGBT regions 10 may be three or more or three or less, and the number of the diode regions 20 may be two or more or two or less. In addition, the IGBT region 10 and the diode region 20 in FIG. 1 may be interchanged in position, or all the IGBT regions 10 may be sandwiched between the diode regions 20. In addition, the IGBT region 10 and the diode region 20 may be provided adjacent to each other one by one.

As shown in FIG. 1, a pad region 40 is provided adjacent to the IGBT region 10 on the lower side on the paper surface. The pad region 40 is a region where a control pad 41 for controlling the semiconductor device 100 is provided. The IGBT region 10 and the diode region 20 are collectively referred to as a cell region. A termination region 30 is provided around the combined region of the cell region and the pad region 40 in order to hold the withstand voltage of the semiconductor device 100. For the termination region 30, a known withstand voltage holding structure can be appropriately selected and provided. For example, the withstand voltage holding structure may be configured by providing a field limiting ring (FLR) surrounding the cell region with a p-type termination well layer of a p-type semiconductor or a variation of lateral doping (VLD) surrounding the cell region with a p-type termination well layer with a concentration gradient on the first main surface side being the front surface side of the semiconductor device 100, and the number of ring-shaped p-type termination well layers used for the FLR and the concentration distribution used for the VLD may be appropriately selected according to the withstand voltage design of the semiconductor device 100. In addition, a p-type termination well layer may be provided over substantially the entire pad region 40, and an IGBT cell, or a diode cell may be provided in the pad region 40.

The control pad 41 may include, for example, a current sense pad 41a, a Kelvin emitter pad 41b, a gate pad 41c, and temperature sense diode pads 41d and 41e. The current sense pad 41a is a control pad for detecting a current flowing through a cell region of the semiconductor device 100, and is a control pad electrically connected to some IGBT cells or diode cells of the cell regions so that when a current flows through the cell regions of the semiconductor device 100, a current of a fraction to one several-tens-of-thousandth of a current flowing through the entire cell region flows.

The Kelvin emitter pad 41b and the gate pad 41c are control pads to which a gate drive voltage for controlling on/off of the semiconductor device 100 is applied. The Kelvin emitter pad 41b is electrically connected to the p-type base layer of the IGBT cell, and the gate pad 41c is electrically connected to the gate trench electrode of the IGBT cell. The Kelvin emitter pad 41b and the p-type base layer may be electrically connected through a p⁺-type contact layer. The temperature sense diode pads 41d and 41e are control pads electrically connected to an anode and a cathode of a temperature sense diode provided in the semiconductor device 100. Measurement of a voltage between an anode and a cathode of a temperature sense diode (not shown) provided in the cell region measures the temperature of the semiconductor device 100.

Figure 2:
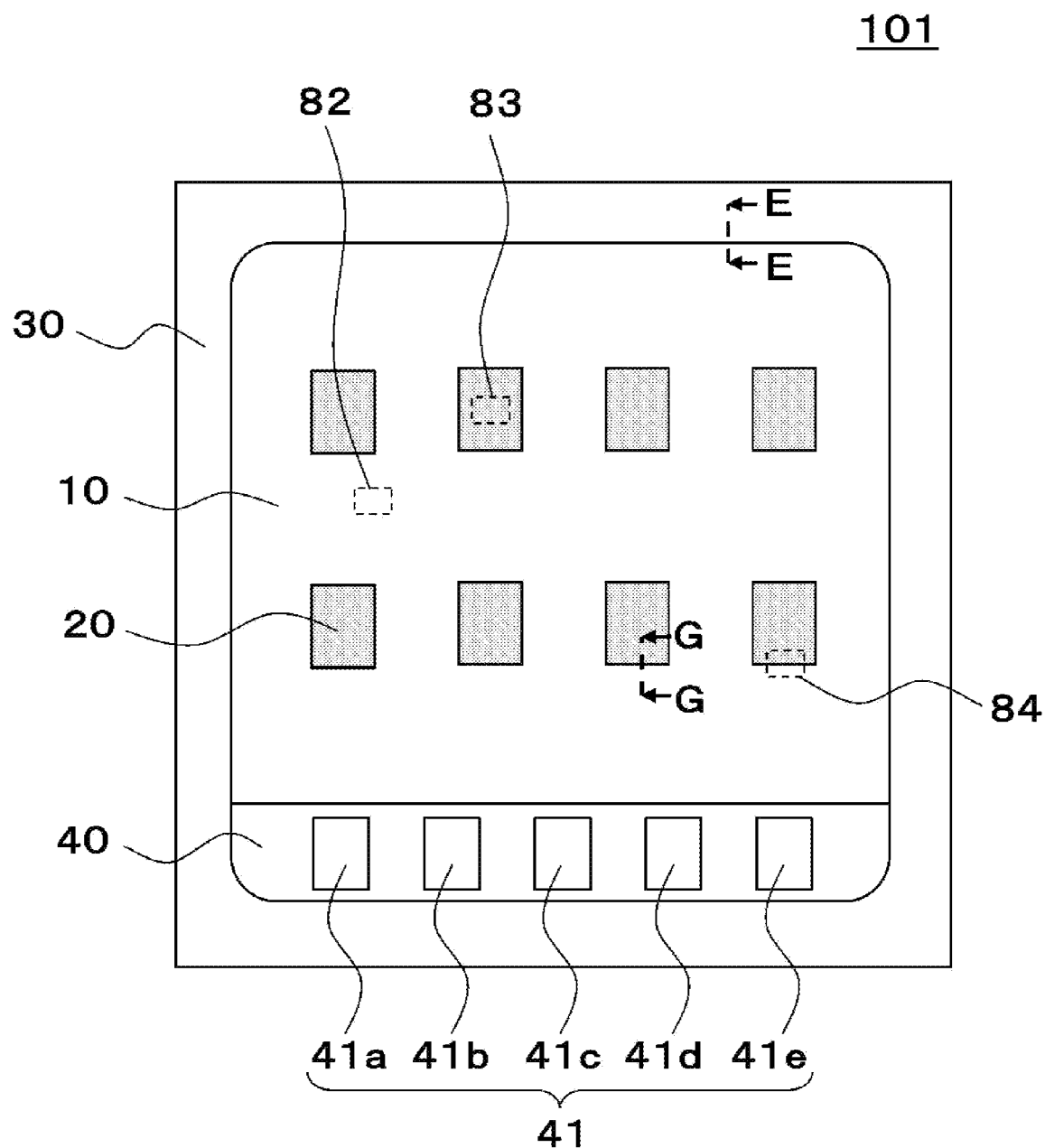
FIG. 2 is a plan view showing a semiconductor device having another configuration according to the first preferred embodiment.

FIG. 2 is a plan view showing a semiconductor device having another configuration according to the first preferred embodiment. The semiconductor device 101 shown in FIG. 2 is an RC-IGBT in which a plurality of diode regions 20 are provided in the longitudinal direction and the lateral direction, and an IGBT region 10 is provided around the diode regions 20, and may be simply referred to as an "island type" RC-IGBT.

In FIG. 2, the semiconductor device 101 includes an IGBT region 10 and diode regions 20 in one semiconductor device. The IGBT region 10 and the diode region 20 are provided side by side in a first direction (up-down direction on the paper surface) along the first main surface of the semiconductor substrate constituting the semiconductor device 101. A plurality of diode regions 20 are arranged side by side in each of the longitudinal direction and the lateral direction in the semiconductor device, and the diode region 20 is surrounded by the IGBT region 10. That is, the plurality of diode regions 20 are provided in an island shape in the IGBT region 10. In FIG. 2, the diode regions 20 are provided in a matrix of 4 columns in the left-right direction on the paper surface and 2 rows in the up-down direction on the paper surface. However, the number and arrangement of the diode regions 20 are not limited to this, and one or more diode regions 20 have only to be provided in the IGBT region 10 in an interspersed manner, and each diode region 20 has only to be surrounded by the IGBT region 10.

In the semiconductor device 101, similarly to the semiconductor device 100 shown in FIG. 1, a region where the IGBT region 10 and the diode regions 20 are combined is a cell region. A termination region 30 having a configuration similar to that of the semiconductor device 100 shown in FIG. 1 is provided around the combined region of the cell region and the pad region 40.

Figure 3:
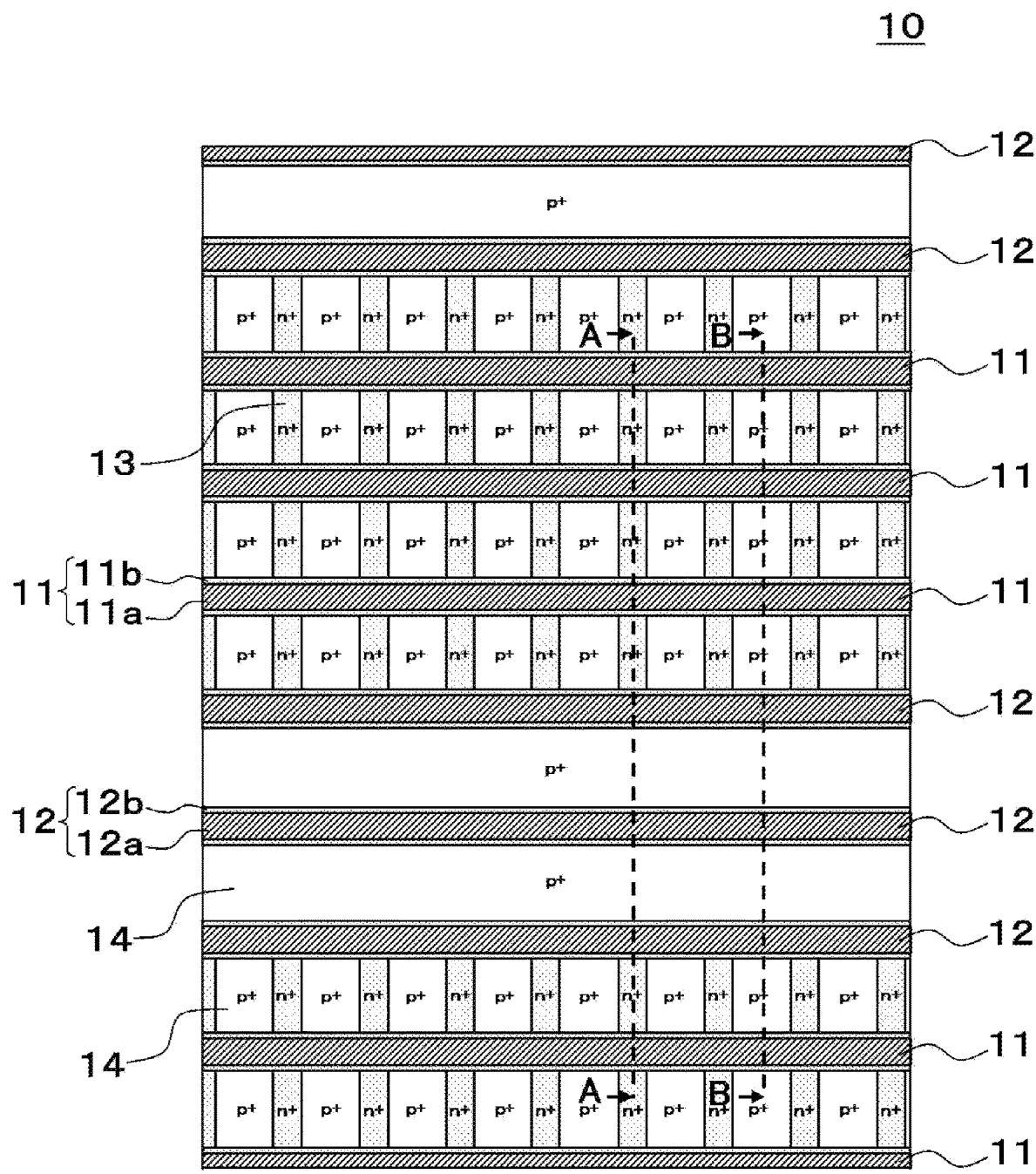
FIG. 3 is a partially enlarged plan view showing a configuration of an IGBT region of the semiconductor device according to the first preferred embodiment.
Figure 4:
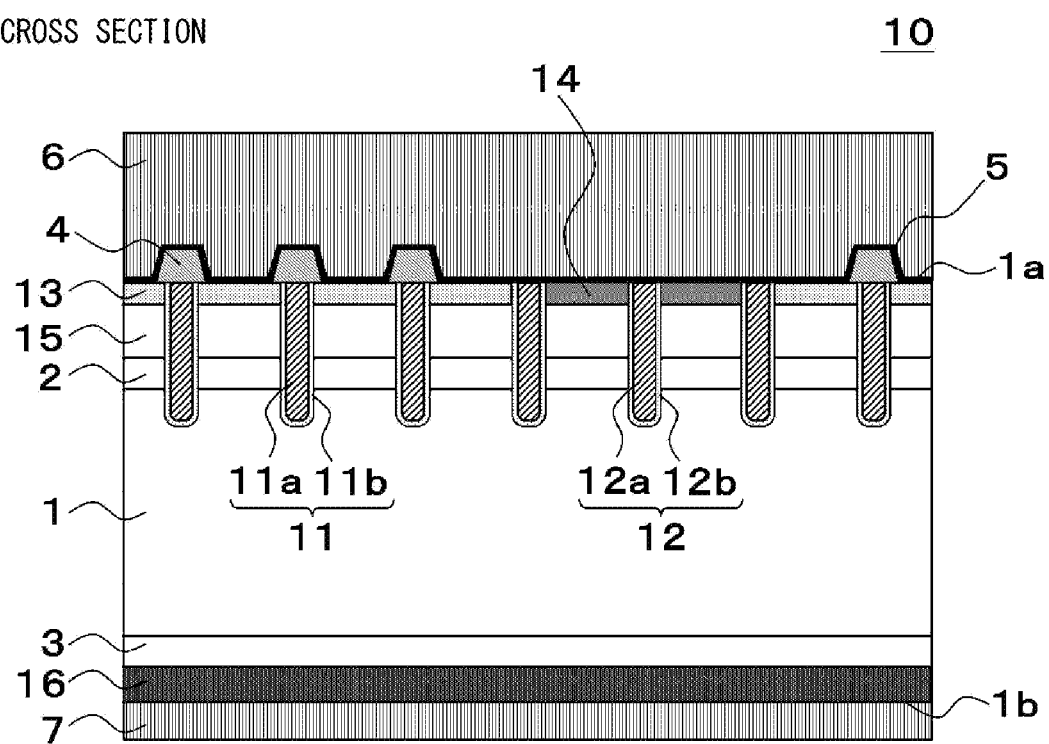
FIGS. 4 and 5 are cross-sectional views each showing a configuration of the IGBT region of the semiconductor device according to the first preferred embodiment.
Figure 5:
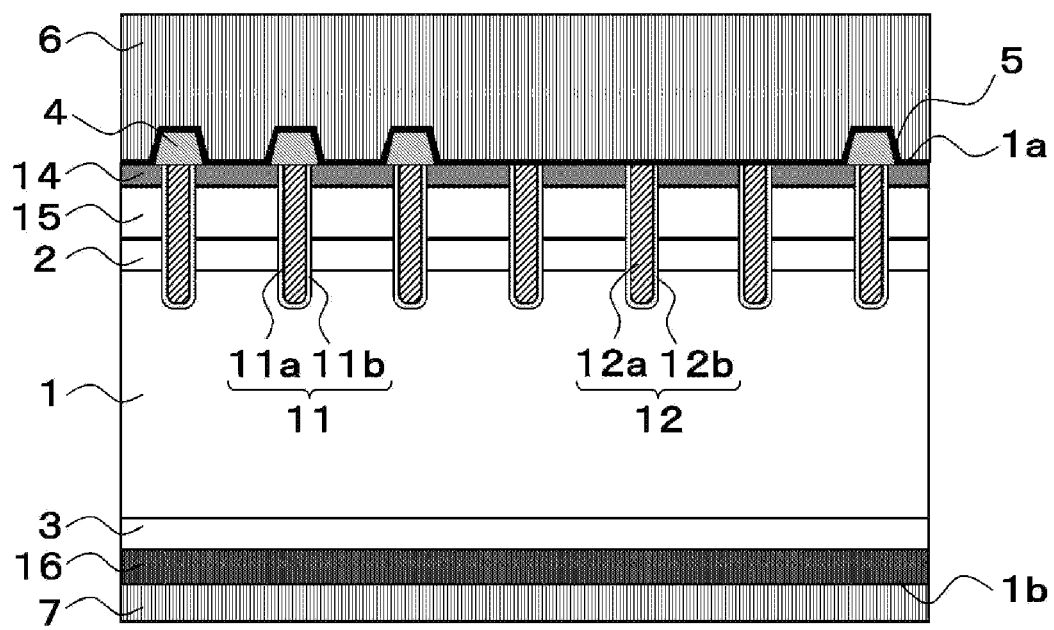

FIG. 3 is a partially enlarged plan view showing a configuration of an IGBT region of a semiconductor device being an RC-IGBT. In addition, FIGS. 4 and 5 are cross-sectional views showing a configuration of an IGBT region of a semiconductor device being an RC-IGBT. FIG. 3 is an enlarged view of a region surrounded by a broken line 82 in the semiconductor device 100 shown in FIG. 1 or the semiconductor device 101 shown in FIG. 2. FIG. 4 is a cross-sectional view of the semiconductor device 100 or the semiconductor device 101 taken along the broken line A-A shown in FIG. 3, and FIG. 5 is a cross-sectional view of the semiconductor device 100 or the semiconductor device 101 taken along the broken line B-B shown in FIG. 3.

As shown in FIG. 3, the IGBT region 10 is provided with an active trench gate 11 and a dummy trench gate 12 in a stripe shape. In the semiconductor device 100 and the semiconductor device 101, the active trench gate 11 and the dummy trench gate 12 extend in a second direction (left-right direction on the paper surface) orthogonal to the first direction being a direction in which the IGBT region 10 and the diode region 20 are side-by-side.

The active trench gate 11 is configured such that a gate trench electrode 11a is provided in a trench formed in a semiconductor substrate with the interposition of a gate trench insulating film 11b. The dummy trench gate 12 is configured such that a dummy trench electrode 12a is provided in a trench formed in a semiconductor substrate with the interposition of a dummy trench insulating film 12b. The gate trench electrode 11a and the dummy trench electrode 12a are IGBT trench electrodes provided in the IGBT region 10. The gate trench electrode 11a of the active trench gate 11 is a gate electrode electrically connected to the gate pad 41c and for switching between an ON state and an OFF state of the IGBT cell in the IGBT region 10. The dummy trench electrode 12a of the dummy trench gate 12 is electrically connected to the emitter electrode provided on the first main surface of the semiconductor device 100 or the semiconductor device 101.

The n$^+$-type emitter layer 13 is provided in contact with the gate trench insulating film 11b on both sides in the width direction of the active trench gate 11. The n$^+$-type emitter layer 13 is a semiconductor layer containing, for example, arsenic (As) or phosphorus (P), or the like as n-type impurities, and the concentration of the n-type impurities is $1.0 \times 10^{17}/cm^3$ to $1.0 \times 10^{20}/cm^3$. The n$^+$-type emitter layer 13 and the p$^+$-type contact layer 14 are alternately provided along the extending direction of the active trench gate 11. The p$^+$-type contact layer 14 is also provided between two adjacent dummy trench gates 12. The p$^+$-type contact layer 14 is a semiconductor layer containing, for example, boron (B), aluminum (Al), or the like as p-type impurities, and the concentration of the p-type impurities is $1.0 \times 10^{15}/cm^3$ to $1.0 \times 10^{20}/cm^3$.

The p$^+$-type contact layer 14 is a semiconductor layer formed to have a higher p-type impurity concentration than the p-type base layer in a surface layer portion of the p-type base layer in order to improve electrical connection between the emitter electrode and the p-type base layer, and the p$^+$-type contact layer 14 will be described as a part of the p-type base layer in the present disclosure. The p$^+$-type contact layer 14 is not necessarily required, and a p-type base layer may be provided instead of the p$^+$-type contact layer 14 in the plan view in FIG. 3.

As shown in FIG. 3, in the IGBT region 10 of the semiconductor device 100 or the semiconductor device 101, three side-by-side dummy trench gates 12 are arranged next to three side-by-side active trench gates 11, and three side-by-side active trench gates 11 are arranged next to three side-by-side dummy trench gates 12. As described above, the IGBT region 10 has a configuration in which a set of active trench gates 11 and a set of dummy trench gates 12 are alternately arranged. In FIG. 3, the number of active trench gates 11 included in one set of active trench gates 11 is 3, and has only to be 1 or more. In addition, the number of dummy trench gates 12 included in one set of dummy trench gates 12 may be 1 or more, and the number of dummy trench gates 12 may be 0. That is, all the trenches provided in the IGBT region 10 may be used as the active trench gate 11. In other words, the IGBT trench electrodes may be the gate trench electrodes 11a fully consisting of the active trench gates 11.

FIG. 4 is a cross-sectional view of the semiconductor device 100 or the semiconductor device 101 taken along the broken line A-A in FIG. 3, and is a cross-sectional view of the IGBT region 10. The semiconductor device 100 or the semiconductor device 101 includes an n$^-$-type drift layer 1 made of a semiconductor substrate. The n$^-$-type drift layer 1 is a semiconductor layer containing, for example, arsenic (As) or phosphorus (P), or the like as n-type impurities, and the concentration of the n-type impurities is $1.0 \times 10^{12}/cm^3$ to $1.0 \times 10^{15}/cm^3$. In FIG. 4, the semiconductor substrate is in a range from the n$^+$-type emitter layer 13 and the p$^+$-type contact layer 14 to the p-type collector layer 16. In FIG. 4, the upper end on the paper surface of the n$^+$-type emitter layer 13 and the p$^+$-type contact layer 14 is referred to as a first main surface 1a of the semiconductor substrate, and the lower end on the paper surface of the p-type collector layer 16 is referred to as a second main surface 1b of the semiconductor substrate. The first main surface 1a of the semiconductor substrate is a main surface on the front surface side of the semiconductor device 100, and the second main surface 1b of the semiconductor substrate is a main surface on the back surface side of the semiconductor device 100. In the IGBT region 10 being a cell region, the semiconductor device 100 includes a n$^-$-type drift layer 1 between the first main surface 1a and the second main surface 1b facing the first main surface 1a.

As shown in FIG. 4, in the IGBT region 10, on the first main surface 1a side of the n$^-$-type drift layer 1, an n-type carrier accumulation layer 2 having a higher concentration of n-type impurities than the n$^-$-type drift layer 1 is provided in contact with the n$^-$-type drift layer 1. The n-type carrier accumulation layer 2 is a semiconductor layer containing, for example, arsenic (As) or phosphorus (P), or the like as n-type impurities, and the concentration of the n-type impurities is $1.0 \times 10^{13}/cm^3$ to $1.0 \times 10^{17}/cm^3$. Providing the n-type carrier accumulation layer 2 allows conduction loss when a current flows through the IGBT region 10 to be reduced.

The n-type carrier accumulation layer 2 is formed by ion-implanting n-type impurities into a semiconductor substrate constituting the n$^-$-type drift layer 1, and then diffusing the n-type impurities implanted by annealing into the semiconductor substrate being the n$^-$-type drift layer 1. Therefore, near the boundary from the n$^-$-type drift layer 1 toward the n-type carrier accumulation layer 2, a concentration distribution in which the n-type impurity concentration gently increases is obtained. In the present disclosure, a position at which an n-type impurity concentration in a direction from the n$^-$-type drift layer 1 toward the n-type carrier accumulation layer 2 when the n-type impurity concentration from the n$^-$-type drift layer 1 toward the n-type carrier accumulation layer 2 is measured by a spreading resistance method (SR method) is higher by 2% or more than an average impurity concentration of the n$^-$-type drift layer 1 is defined as a boundary between the n$^-$-type drift layer 1 and the n-type carrier accumulation layer 2.

A p-type base layer 15 is provided on the first main surface 1a side of the n-type carrier accumulation layer 2. The p-type base layer 15 is a semiconductor layer containing, for example, boron (B) or aluminum (Al), or the like as p-type impurities, and the concentration of the p-type impurities is $1.0 \times 10^{12}/cm^3$ to $1.0 \times 10^{19}/cm^3$. The p-type base layer 15 is in contact with the gate trench insulating film 11b of the active trench gate 11. On the first main surface side of the p-type base layer 15, an n$^+$-type emitter layer 13 is provided in contact with the gate trench insulating film 11b of the active trench gate 11, and a p+-type contact layer 14 is provided in the remaining region. The n+-type emitter layer 13 and the p+-type contact layer 14 constitute a first main surface 1a of the semiconductor substrate. It should be noted that the p+-type contact layer 14 is a partial region of the p-type base layer having a higher p-type impurity concentration than the p-type base layer 15 as described above, and in the present disclosure, the p+-type contact layer 14 and the p-type base layer 15 are collectively referred to as a p-type base layer unless the p+-type contact layer 14 and the p-type base layer 15 are particularly distinguished from each other.

In addition, in the semiconductor device 100 or the semiconductor device 101, an n-type buffer layer 3 having a higher concentration of n-type impurities than the n−-type drift layer 1 is provided on the second main surface 1b side of the n−-type drift layer 1. The n-type buffer layer 3 is provided to suppress punch-through of a depletion layer extending from the p-type base layer 15 to the second main surface side when the semiconductor device 100 is in an off state. The n-type buffer layer 3 may be formed by, for example, implanting phosphorus (P) or protons (H+), or may be formed by implanting both phosphorus and protons. The n-type impurity concentration of the n-type buffer layer 3 is $1.0 \times 10^{12}/cm^3$ to $1.0 \times 10^{18}/cm^3$. It should be noted that the semiconductor device 100 or the semiconductor device 101 may have a configuration in which the n−-type drift layer 1 is also provided in the region of the n-type buffer layer 3 shown in FIG. 4 without provided with the n-type buffer layer 3. The n-type buffer layer 3 and the n−-type drift layer 1 may be collectively referred to as a drift layer.

The semiconductor device 100 or the semiconductor device 101 is provided with a p-type collector layer 16 on the second main surface 1b side of the n-type buffer layer 3. That is, the p-type collector layer 16 is provided between the n−-type drift layer 1 and the second main surface 1b. The p-type collector layer 16 is a semiconductor layer containing, for example, boron (B) or aluminum (Al), or the like as p-type impurities, and the concentration of the p-type impurities is $1.0 \times 10^{16}/cm^3$ to $1.0 \times 10^{20}/cm^3$. The p-type collector layer 16 constitutes the second main surface 1b of the semiconductor substrate. The p-type collector layer 16 is provided not only in the IGBT region 10 but also in the termination region 30, and in the p-type collector layer 16, a portion provided in the termination region 30 constitutes a p-type termination collector layer. In addition, the p-type collector layer 16 may be provided to partially protrude from the IGBT region 10 to the diode region 20.

As shown in FIG. 4, in the semiconductor device 100 or the semiconductor device 101, a trench that penetrates the p-type base layer 15 and the n-type carrier accumulation layer 2 from the first main surface 1a of the semiconductor substrate to reach the n−-type drift layer 1 is formed. Providing a gate trench electrode 11a in the trench with the interposition of a gate trench insulating film 11b constitutes an active trench gate 11. The gate trench electrode 11a faces the n−-type drift layer 1 with the interposition of the gate trench insulating film 11b. In addition, providing a dummy trench electrode 12a in the trench with the interposition of a dummy trench insulating film 12b constitutes a dummy trench gate 12. The dummy trench electrode 12a faces the n−-type drift layer 1 with the interposition of the dummy trench insulating film 12b. The gate trench insulating film 11b of the active trench gate 11 is in contact with the p-type base layer 15 and the n+-type emitter layer 13. Application of a gate drive voltage to the gate trench electrode 11a forms a channel in the p-type base layer 15 in contact with the gate trench insulating film 11b of the active trench gate 11.

As shown in FIG. 4, an interlayer insulating film 4 is provided on the gate trench electrode 11a of the active trench gate 11. A barrier metal 5 is formed on a region where the interlayer insulating film 4 is not provided on the first main surface of the semiconductor substrate, and on the interlayer insulating film 4. The barrier metal 5 may be, for example, a conductor containing titanium (Ti), and may be, for example, titanium nitride, or TiSi obtained by alloying titanium and silicon (Si). As shown in FIG. 4, the barrier metal 5 is in ohmic contact with the n+-type emitter layer 13, the p+-type contact layer 14, and the dummy trench electrode 12a, and is electrically connected to the n+-type emitter layer 13, the p+-type contact layer 14, and the dummy trench electrode 12a.

An emitter electrode 6 is provided on the barrier metal 5. The emitter electrode 6 may be formed of, for example, an aluminum alloy such as an aluminum silicon alloy (Al—Si-based alloy), or may be an electrode including a plurality of layers of metal films in which a plating film is formed on an electrode formed of an aluminum alloy by electroless plating or electrolytic plating. The plating film formed by electroless plating or electrolytic plating may be, for example, a nickel (Ni) plating film or a copper (CU) plating film. In addition, when there is a region which is minute between adjacent interlayer insulating films 4 or the like and in which favorable embedding cannot be obtained in the emitter electrode 6, tungsten having better embeddability than the emitter electrode 6 may be arranged in the minute region, and the emitter electrode 6 may be provided on the tungsten.

It should be noted that the emitter electrode 6 may be provided on the n+-type emitter layer 13, the p+-type contact layer 14, and the dummy trench electrode 12a without the barrier metal 5 being provided. In addition, the barrier metal 5 may be provided only on an n-type semiconductor layer such as the n+-type emitter layer 13. The barrier metal 5 and the emitter electrode 6 may be collectively referred to as an emitter electrode. It should be noted that although FIG. 4 shows the configuration in which the interlayer insulating film 4 is not provided on the dummy trench electrode 12a of the dummy trench gate 12, the interlayer insulating film 4 may be formed on the dummy trench electrode 12a of the dummy trench gate 12. When the interlayer insulating film 4 is formed on the dummy trench electrode 12a of the dummy trench gate 12, the emitter electrode 6 and the dummy trench electrode 12a may be electrically connected in a cross section different from the cross section shown in FIG. 4.

A collector electrode 7 is provided on the second main surface 1b side of the p-type collector layer 16. Similarly to the emitter electrode 6, the collector electrode 7 may be made of an aluminum alloy, or an aluminum alloy and a plating film. In addition, the collector electrode 7 may have a configuration different from that of the emitter electrode 6. The collector electrode 7 is in ohmic contact with the p-type collector layer 16 and is electrically connected to the p-type collector layer 16.

FIG. 5 is a cross-sectional view of the semiconductor device 100 or the semiconductor device 101 taken along the broken line B-B in FIG. 3, and is a cross-sectional view of the IGBT region 10. The cross-sectional view taken along a broken line B-B in FIG. 5 is different from the cross-sectional view taken along a broken line A-A shown in FIG. 4 in that the n+-type emitter layer 13 provided on the first main surface side of the semiconductor substrate in contact with the active trench gate 11 is not seen. That is, as shown in FIG. 3, the n+-type emitter layer 13 is selectively provided on the first main surface 1a side of the p-type base layer. It should be noted that the p-type base layer referred to here is a p-type base layer which the p-type base layer 15 and the p+-type contact layer 14 are collectively referred to.

Figure 6:
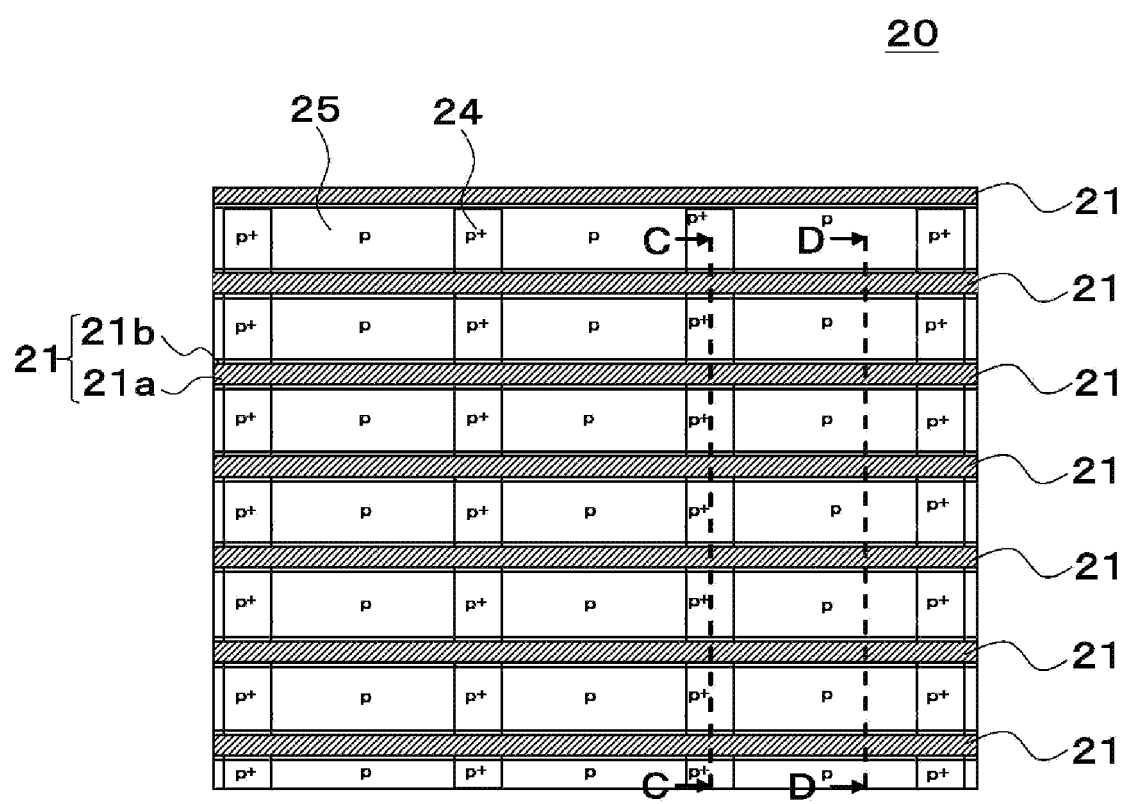
FIG. 6 is a partially enlarged plan view showing a configuration of a diode region of the semiconductor device according to the first preferred embodiment.
Figure 7:
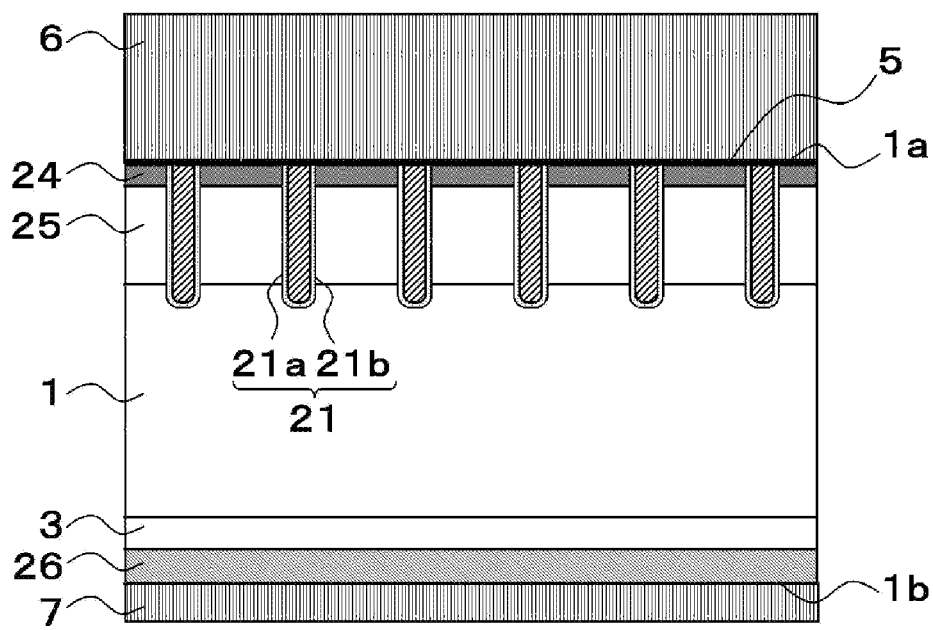
FIGS. 7 and 8 are cross-sectional views each showing a configuration of the diode region of the semiconductor device according to the first preferred embodiment.
Figure 8:
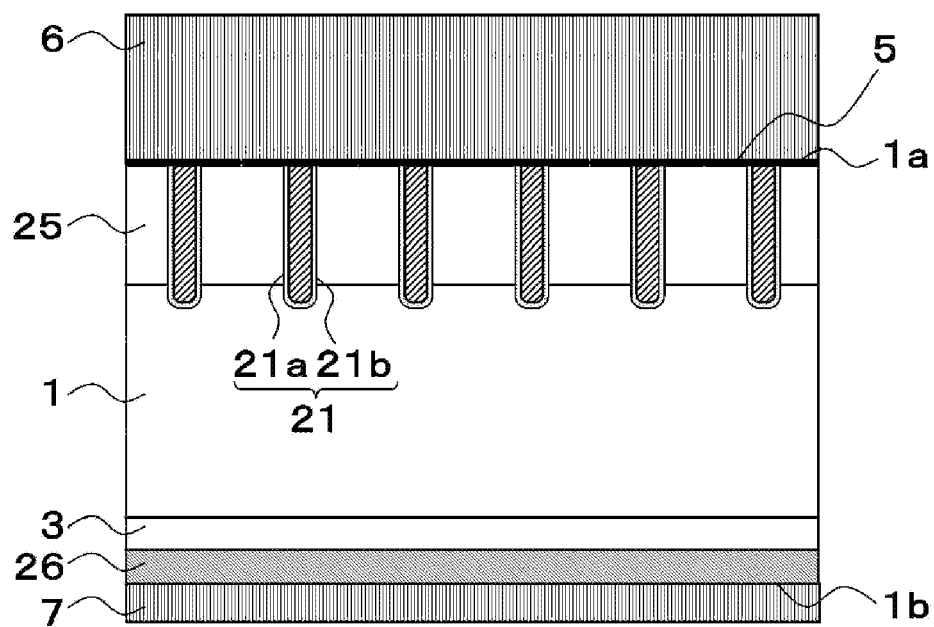

FIG. 6 is a partially enlarged plan view showing a configuration of a diode region of a semiconductor device being an RC-IGBT. In addition, FIGS. 7 and 8 are cross-sectional views showing a configuration of a diode region of a semiconductor device being an RC-IGBT. FIG. 6 is an enlarged view of a region surrounded by a broken line 83 in the semiconductor device 100 shown in FIG. 1 or the semiconductor device 101. FIG. 7 is a cross-sectional view of the semiconductor device 100 taken along a broken line C-C shown in FIG. 6. FIG. 8 is a cross-sectional view of the semiconductor device 100 taken along a broken line D-D shown in FIG. 6.

The diode trench gate 21 extends along the first main surface 1a of the semiconductor device 100 or the semiconductor device 101 in a second direction (left-right direction on the paper surface) orthogonal to the first direction in which the IGBT region 10 and the diode region 20 are side by side. The diode trench gate 21 is configured by providing a diode trench electrode 21a in a trench formed in the semiconductor substrate of the diode region 20 with the interposition of a diode trench insulating film 21b. The diode trench electrode 21a faces the n−-type drift layer 1 with the interposition of the diode trench insulating film 21b.

A p+-type contact layer 24 and a p-type anode layer 25 are provided between the two adjacent diode trench gates 21. The p+-type contact layer 24 is a semiconductor layer containing, for example, boron or aluminum as p-type impurities, and the concentration of the p-type impurities is $1.0 \times 10^{15}/cm^3$ to $1.0 \times 10^{20}/cm^3$. The p-type anode layer 25 is a semiconductor layer containing, for example, boron or aluminum as p-type impurities, and the concentration of the p-type impurities is $1.0 \times 10^{12}/cm^3$ to $1.0 \times 10^{19}/cm^3$. The p+-type contact layer 24 and the p-type anode layer 25 are alternately provided in the second direction being the longitudinal direction of the diode trench gate 21.

FIG. 7 is a cross-sectional view of the semiconductor device 100 or the semiconductor device 101 taken along a broken line C-C in FIG. 6, and is a cross-sectional view of the diode region 20. The semiconductor device 100 or the semiconductor device 101 includes the n−-type drift layer 1 made of a semiconductor substrate also in the diode region 20 similarly to the IGBT region 10. The n−-type drift layer 1 in the diode region 20 and the n−-type drift layer 1 in the IGBT region 10 are continuously and integrally formed, and are formed of the same semiconductor substrate. In FIG. 7, the semiconductor substrate ranges from the p+-type contact layer 24 to the n+-type cathode layer 26. In FIG. 7, the upper end on the paper surface of the p+-type contact layer 24 is referred to as a first main surface 1a of the semiconductor substrate, and the lower end on the paper surface of the n+-type cathode layer 26 is referred to as a second main surface 1b of the semiconductor substrate. The first main surface 1a of the diode region 20 and the first main surface 1a of the IGBT region 10 are coplanar, and the second main surface 1b of the diode region 20 and the second main surface 1b of the IGBT region 10 are coplanar.

As shown in FIG. 7, unlike in the IGBT region 10, in the diode region 20, a p-type anode layer 25 is provided on the first main surface 1a side of the n−-type drift layer 1. The p-type anode layer 25 is provided between the n−-type drift layer 1 and the first main surface 1a. The p-type anode layer 25 is provided up to a position deeper from the first main surface 1a than the boundary between the n-type carrier accumulation layer 2 and the n−-type drift layer 1 in the IGBT region 10. That is, the depth from the first main surface 1a to the position of the boundary between the p-type anode layer 25 and the ri type drift layer 1 is larger than the depth from the first main surface 1a to the position of the boundary between the n-type carrier accumulation layer 2 and the n−-type drift layer 1. As described above, forming the p-type anode layer 25 to a position deeper than the n-type carrier accumulation layer 2 allows the semiconductor device 100 or the semiconductor device 101 to suppress electric field concentration on the n-type carrier accumulation layer 2 and suppress a decrease in withstand voltage.

The p-type anode layer 25 is a semiconductor layer containing, for example, boron (B), aluminum (Al), or the like as p-type impurities, the concentration of the p-type impurities is $1.0 \times 10^{12}/cm^3$ to $1.0 \times 10^{19}/cm^3$, and the p-type impurity concentration of the p-type anode layer is higher than the n-type impurity concentration of the n-type carrier accumulation layer 2 of the IGBT region 10. The p-type anode layer 25 may have the same concentration of p-type impurities as the p-type base layer 15 of the IGBT region 10. In addition, making the p-type impurity concentration of the p-type anode layer 25 lower than the p-type impurity concentration of the p-type base layer 15 of the IGBT region 10 may reduce the amount of holes injected into the diode region 20 during diode operation. Reducing the amount of holes injected during diode operation allows recovery loss during diode operation to be reduced.

A p+-type contact layer 24 is provided on the first main surface 1a side of the p-type anode layer 25. The concentration of the p-type impurities of the p+-type contact layer 24 may be the same as or different from the concentration of the p-type impurities of the p+-type contact layer 14 of the IGBT region 10. The p+-type contact layer 24 constitutes the first main surface 1a of the semiconductor substrate. It should be noted that the p+-type contact layer 24 is a region having a higher p-type impurity concentration than the p-type anode layer 25, the p+-type contact layer 24 and the p-type anode layer 25 may be referred to individually when it is necessary to distinguish them, or the p+-type contact layer 24 and the p-type anode layer 25 may be collectively referred to as a p-type anode layer.

In addition, as shown in FIG. 7, also in the diode region 20 of the semiconductor device 100 or the semiconductor device 101, similarly to the IGBT region 10, the n-type buffer layer 3 is provided on the second main surface 1b side of the n−-type drift layer 1. The n-type buffer layer 3 of the diode region 20 may be continuously and integrally formed with the n-type buffer layer 3 of the IGBT region 10. The n−-type drift layer 1 and the n-type buffer layer 3 may be collectively referred to as a drift layer.

The diode region 20 is provided with an n+-type cathode layer 26 on the second main surface 1b side of the n-type buffer layer 3. The n+-type cathode layer 26 is provided between the n−-type drift layer 1 and the second main surface 1b. The n+-type cathode layer 26 is a semiconductor layer containing, for example, arsenic (As) or phosphorus (P), or the like as n-type impurities, and the concentration of the n-type impurities is $1.0 \times 10^{16}/cm^3$ to $1.0 \times 10^{21}/cm^3$. The n+-type cathode layer 26 is provided in part or the whole of the diode region 20. The n+-type cathode layer 26 constitutes the second main surface 1b of the semiconductor substrate. It should be noted that although not shown, a p-type impurity may be further selectively implanted into the region where the n+-type cathode layer 26 is formed as described above, and the p$^+$-type cathode layer may be provided using a part of the region where the n$^+$-type cathode layer 26 is formed as a p-type semiconductor. For example, an n$^+$-type cathode layer and a p$^+$-type cathode layer may be alternately arranged along the second main surface 1b of the semiconductor substrate, and a diode having this configuration is known as a relaxed field of cathode (RFC) diode.

As shown in FIG. 7, a trench that penetrates the p-type anode layer 25 from the first main surface 1a of the semiconductor substrate to reach the n$^-$-type drift layer 1 is formed in the diode region 20 of the semiconductor device 100 or the semiconductor device 101. Providing a diode trench electrode 21a in the trench of the diode region 20 with the interposition of the diode trench insulating film 21b constitutes a diode trench gate 21. The diode trench electrode 21a faces the n$^-$-type drift layer 1 with the interposition of the diode trench insulating film 21b.

As shown in FIG. 7, a barrier metal 5 is provided on the diode trench electrode 21a and the p$^+$-type contact layer 24. The barrier metal 5 is in ohmic contact with the diode trench electrode 21a and the p$^+$-type contact layer 24, and is electrically connected to the diode trench electrode 21a and the p$^+$-type contact layer 24. The barrier metal 5 may have the same configuration as the barrier metal 5 in the IGBT region 10. An emitter electrode 6 is provided on the barrier metal 5. The emitter electrode 6 provided in the diode region 20 is continuously formed with the emitter electrode 6 provided in the IGBT region 10. It should be noted that as with the case of the IGBT region 10, the diode trench electrode 21a and the p$^+$-type contact layer 24 may be brought into ohmic contact with the emitter electrode 6 without the barrier metal 5 being provided. In addition, the barrier metal 5 may be provided in the IGBT region 10, and the barrier metal 5 may not be provided in the diode region 20. At this time, the p-type impurity concentration of the p-type anode layer of the diode region 20 may be lower than the p-type impurity concentration of the p-type base layer of the IGBT region 10.

It should be noted that although FIG. 7 shows the configuration in which the interlayer insulating film 4 is not provided on the diode trench electrode 21a of the diode trench gate 21, an interlayer insulating film 4 may be formed on the diode trench electrode 21a of the diode trench gate 21. When the interlayer insulating film 4 is formed on the diode trench electrode 21a of the diode trench gate 21, the emitter electrode 6 and the diode trench electrode 21a may be electrically connected in a cross section different from the cross section shown in FIG. 7.

A collector electrode 7 is provided on the second main surface side of the n$^+$-type cathode layer 26. As with the emitter electrode 6, the collector electrode 7 of the diode region 20 is formed continuously with the collector electrode 7 provided in the IGBT region 10. The collector electrode 7 is in ohmic contact with the n$^+$-type cathode layer 26 and is electrically connected to the n$^+$-type cathode layer 26.

FIG. 8 is a cross-sectional view of the semiconductor device 100 or the semiconductor device 101 taken along a broken line D-D in FIG. 6, and is a cross-sectional view of the diode region 20. FIG. 8 is different from the cross-sectional view taken along a broken line C-C shown in FIG. 7 in that the p$^+$-type contact layer 24 is not provided between the p-type anode layer 25 and the barrier metal 5, and the p-type anode layer 25 constitutes the first main surface of the semiconductor substrate. That is, the p$^+$-type contact layer 24 shown in FIG. 7 is selectively provided on the first main surface side of the p-type anode layer 25.

Figure 9:
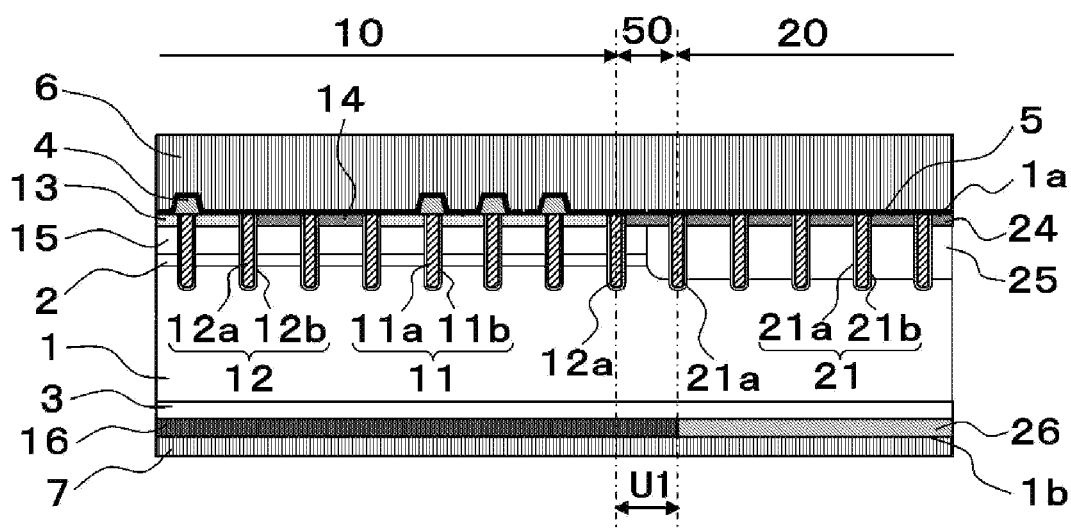
FIG. 9 is a cross-sectional view showing a configuration of a boundary between an IGBT region and a diode region of the semiconductor device according to the first preferred embodiment.

FIG. 9 is a cross-sectional view showing a configuration of a boundary between an IGBT region and a diode region of a semiconductor device being an RC-IGBT. FIG. 9 is a cross-sectional view taken along a broken line G-G in the semiconductor device 100 shown in FIG. 1 or the semiconductor device 101 shown in FIG. 2.

As shown in FIG. 9, the semiconductor device 100 or the semiconductor device 101 has a boundary region 50 between the IGBT region 10 and the diode region 20. The boundary region 50 is provided between an IGBT trench electrode closest to the diode region 20 among IGBT trench electrodes being a general term for the gate trench electrode 11a and the dummy trench electrode 12a of the IGBT region 10, and a diode trench electrode closest to the IGBT region 10 among the diode trench electrodes 21a of the diode region 20.

In the present disclosure, the IGBT trench electrode is a trench electrode provided in a trench that penetrates the p-type base layer 15 from the first main surface 1a of the semiconductor substrate to reach the n$^-$-type drift layer 1 with the interposition of an insulating film, and both side surfaces of the IGBT trench electrode facing each other face the p-type base layer 15 with the interposition of the insulating film. The IGBT trench electrode is the gate trench electrode 11a or the dummy trench electrode 12a, and when the gate trench electrode 11a and the dummy trench electrode 12a are referred to without being distinguished from each other, they are referred to as an IGBT trench electrode in the present disclosure.

In addition, in the present disclosure, the diode trench electrode 21a is a trench electrode provided with the interposition of an insulating film in a trench that penetrates the p-type anode layer 25 from the first main surface 1a of the semiconductor substrate to reach the n$^-$-type drift layer 1, and both side surfaces of the diode trench electrode 21a facing each other face the p-type anode layer 25 with the interposition of the insulating film. In addition, as shown in FIG. 9, the diode trench electrode 21a is a diode trench electrode in which the n$^+$-type cathode layer 26 is positioned on the second main surface 1b side of the p-type anode layer 25 facing the side surface with the interposition of the insulating film.

As shown in FIG. 9, the boundary region 50 includes a p-type collector layer 16 between the n$^-$-type drift layer 1 and the second main surface 1b. The boundary between the boundary region 50 and the diode region 20 may be defined as a boundary between the p-type collector layer 16 and the n$^+$-type cathode layer 26 provided on the second main surface 1b side. As described above, providing the p-type collector layer 16 in the boundary region 50 between the IGBT region 10 and the diode region 20 makes it possible to increase the distance between the n$^+$-type cathode layer 26 of the diode region 20 and the active trench gate 11 of the IGBT region 10, and to prevent a current from flowing from a channel formed adjacent to the active trench gate 11 of the IGBT region 10 to the n$^+$-type cathode layer 26 even when a gate drive voltage is applied to the gate trench electrode 11a during reflux diode operation.

Figure 10:
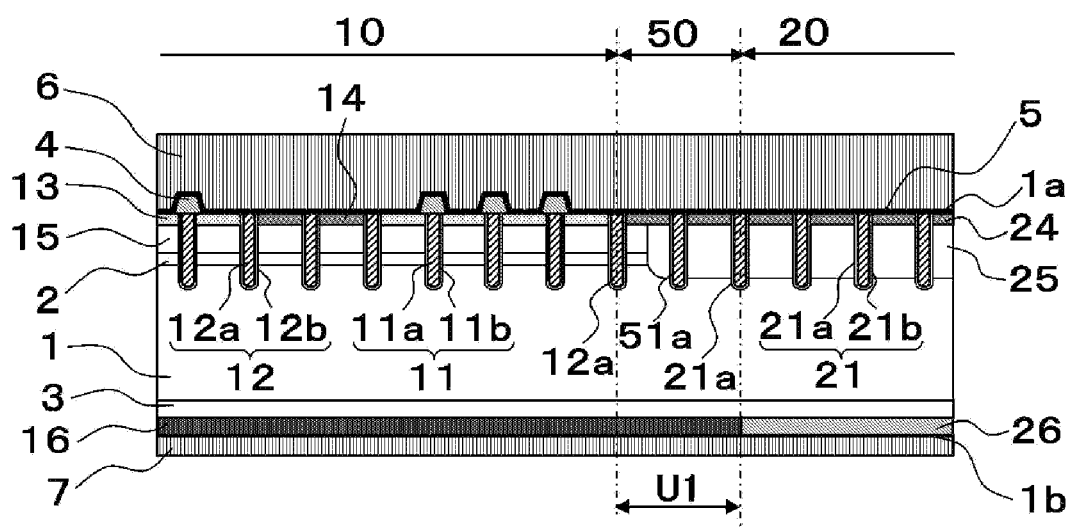
FIG. 10 is a cross-sectional view showing a configuration of a boundary between an IGBT region and a diode region of another semiconductor device according to the first preferred embodiment.

FIG. 10 is a cross-sectional view showing a configuration of a boundary between an IGBT region and a diode region of a semiconductor device being another RC-IGBT. As with FIG. 9, FIG. 10 is a cross-sectional view taken along a broken line G-G in the semiconductor device 100 shown in FIG. 1 or the semiconductor device 101 shown in FIG. 2. In FIG. 9, a trench electrode is not provided in the boundary region 50, but as shown in FIG. 10, one or more boundary trench electrodes 51a provided, with the interposition of an insulating film, in a trench reaching from the first main surface 1a to the n⁻-type drift layer may be provided in the boundary region 50. The width U1 of the boundary region 50 may be, for example, 100 μm. It should be noted that depending on the application of the semiconductor device 100 or the semiconductor device 101 being an RC-IGBT, the width U1 of the boundary region 50 may be a distance smaller than 100 μm, or may be the same width as the distance between the trenches adjacent to each other.

As shown in FIGS. 9 and 10, in the semiconductor device 100 or the semiconductor device 101, the n-type carrier accumulation layer 2 and the p-type anode layer 25 are in contact with each other at the boundary region 50. In addition, the boundary between the p-type anode layer 25 and the n⁻-type drift layer 1 is provided at a position deeper from the first main surface 1a than the boundary between the n-type carrier accumulation layer 2 and the n⁻-type drift layer 1. In the semiconductor device 100 or the semiconductor device 101 of the present disclosure, since the p-type anode layer 25 is provided up to a position deeper than the n-type carrier accumulation layer 2, electric field concentration on the n-type carrier accumulation layer 2 is suppressed, so that a decrease in withstand voltage can be suppressed. In FIG. 10, the position where the n-type carrier accumulation layer 2 and the p-type anode layer 25 are in contact with each other is provided between the dummy trench electrode 12a being an IGBT trench electrode closest to the diode region 20 and the boundary trench electrode 50a, but the position where the n-type carrier accumulation layer 2 and the p-type anode layer 25 are in contact with each other is not particularly limited as long as the position is within the boundary region 50.

It should be noted that in FIGS. 9 and 10, the IGBT trench electrode closest to the diode region 20 is the dummy trench electrode 12a electrically connected to the emitter electrode 6, but the IGBT trench electrode closest to the diode region 20 may be the gate trench electrode 11a electrically connected to the gate pad 41c. As shown in FIGS. 9 and 10, using the IGBT trench electrode closest to the diode region 20 as the dummy trench electrode 12a electrically connected to the emitter electrode 6 makes it possible to prevent the boundary region 50 from contributing to the switching operation, so that it is possible to suppress a decrease in withstand voltage while suppressing an influence on the switching operation of the boundary region 50.

FIGS. 11A and 11B are cross-sectional views showing a configuration of a termination region of a semiconductor device being an RC-IGBT. FIG. 11A is a cross-sectional view taken along a broken line E-E in FIG. 1 or 2, and is a cross-sectional view from the IGBT region 10 to the termination region 30. In addition, FIG. 11B is a cross-sectional view taken along a broken line F-F in FIG. 1, and is a cross-sectional view from the diode region 20 to the termination region 30.

As shown in FIGS. 11A and 11B, the termination region 30 of the semiconductor device 100 includes an n⁻-type drift layer 1 between the first main surface 1a and the second main surface 1b of the semiconductor substrate. The first main surface 1a and the second main surface 1b of the termination region 30 are respectively coplanar with the first main surface 1a and the second main surface 1b of the IGBT region 10 and the diode region 20. In addition, the n⁻-type drift layer 1 in the termination region 30 has the same configuration as the n⁻-type drift layer 1 in the IGBT region 10 and the diode region 20, and is continuously and integrally formed.

A p-type termination well layer 31 is provided on the first main surface 1a side of the n⁻-type drift layer 1, that is, between the first main surface 1a of the semiconductor substrate and the n⁻-type drift layer 1. The p-type termination well layer 31 is a semiconductor layer containing, for example, boron (B), aluminum (Al), or the like as p-type impurities, and the concentration of the p-type impurities is $1.0 \times 10^{14}/cm^3$ to $1.0 \times 10^{19}/cm^3$. The p-type termination well layer 31 is provided to surround a cell region including the IGBT region 10 and the diode region 20. The p-type termination well layer 31 is formed up to a position deeper than the n-type carrier accumulation layer, and is formed up to a position deeper than the trenches formed in the IGBT region 10 and the diode region 20. The p-type termination well layers 31 are provided in a plurality of ring shapes, and the number of the p-type termination well layers 31 to be provided is appropriately selected according to the withstand voltage design of the semiconductor device 100 or the semiconductor device 101. In addition, an n⁺-type channel stopper layer 32 is provided on the further outer edge side of the p-type termination well layer 31, and the n⁺-type channel stopper layer 32 surrounds the p-type termination well layer 31.

A p-type termination collector layer 16a is provided between the n⁻-type drift layer 1 and the second main surface 1b of the semiconductor substrate. The p-type termination collector layer 16a is formed continuously and integrally with the p-type collector layer 16 provided in the cell region. Therefore, the p-type termination collector layer 16a may be included in and referred to as a p-type collector layer 16. In addition, in the configuration in which the diode region 20 is provided adjacent to the termination region 30 as in the semiconductor device 100 shown in FIG. 1, as shown in FIG. 11B, the p-type termination collector layer 16a is provided such that the end portion on the diode region 20 side protrudes toward the diode region 20 by the distance U2. As described above, providing the p-type termination collector layer 16a so as to protrude toward the diode region 20 makes it possible to increase the distance between the n⁺-type cathode layer 26 of the diode region 20 and the p-type termination well layer 31, and to prevent the p-type termination well layer 31 from operating as an anode of a diode. The distance U2 may be, for example, 100 μm.

A collector electrode 7 is provided on the second main surface 1b of the semiconductor substrate. The collector electrode 7 is continuously and integrally formed from a cell region including the IGBT region 10 and the diode region 20 to the termination region 30. On the other hand, an emitter electrode 6 continuous from the cell region and a termination electrode 6a separated from the emitter electrode 6 are provided on the first main surface of the semiconductor substrate in the termination region 30.

The emitter electrode 6 and the termination electrode 6a are electrically connected to each other through the semi-insulating film 33. The semi-insulating film 33 may be, for example, a semi-insulating silicon nitride (sinSiN) film. The termination electrode 6a and the p-type termination well layer 31 and n⁺-type channel stopper layer 32 are electrically connected to each other through a contact hole formed in the interlayer insulating film 4 provided on the first main surface of the termination region 30. In addition, in the termination region 30, a termination protective film 34 is provided to cover the emitter electrode 6, the termination electrode 6a, and the semi-insulating film 33. The termination protective film 34 may be formed of, for example, polyimide.

Next, a method for manufacturing the semiconductor device 100 or the semiconductor device 101 of the present disclosure will be described.

FIGS. 12A to 19B are diagrams showing a method for manufacturing a semiconductor device being an RC-IGBT. FIGS. 12A to 17B are diagrams showing steps of forming the front surface side of the semiconductor device 100 or the semiconductor device 101, and FIGS. 18A to 19B are diagrams showing steps of forming the back surface side of the semiconductor device 100 or the semiconductor device 101.

Figure 12A:
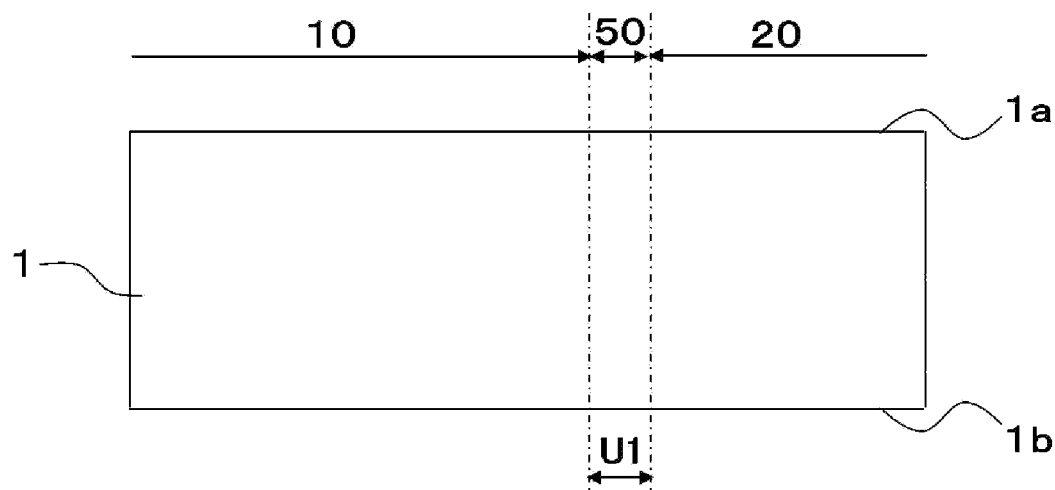

First, as shown in FIG. 12A, a semiconductor substrate constituting the n⁻-type drift layer 1 is prepared. For the semiconductor substrate, for example, what is called an FZ wafer manufactured by a floating zone (FZ) method, or what is called an MCZ wafer manufactured by a magnetic-field applied Czochralski (MCZ) method may be used, and an n-type wafer containing n-type impurities may be used. The concentration of the n-type impurities contained in the semiconductor substrate is appropriately selected according to the withstand voltage of the semiconductor device to be manufactured. For example, in a semiconductor device having a withstand voltage of 1200 V, the concentration of the n-type impurities is adjusted so that the specific resistance of the n⁻-type drift layer 1 constituting the semiconductor substrate is about 40 to 120 Ω·cm. As shown in FIG. 12A, in the step of preparing the semiconductor substrate, the entire semiconductor substrate is the n⁻-type drift layer 1. However, p-type or n-type impurity ions are implanted from the first main surface 1a side or the second main surface 1b side of this semiconductor substrate, and then diffused into the semiconductor substrate by heat treatment or the like to form a p-type or n-type semiconductor layer, and the semiconductor device 100 or the semiconductor device 101 is manufactured.

As shown in FIG. 12A, the semiconductor substrate constituting the n⁻-type drift layer 1 includes a region to be the IGBT region 10, the diode region 20, and the boundary region 50. In addition, although not shown, a region to be the termination region 30 is provided around the region to be the IGBT region 10, the diode region 20, and the boundary region 50. Hereinafter, a method for manufacturing the configurations of the IGBT region 10, the diode region 20, and the boundary region 50 of the semiconductor device 100 or the semiconductor device 101 will be mainly described, but the termination region 30 of the semiconductor device 100 or the semiconductor device 101 may be manufactured by a well-known manufacturing method. For example, when the FLR having the p-type termination well layer 31 as the withstand voltage holding structure is formed in the termination region 30, the FLR may be formed by implanting p-type impurity ions before processing the IGBT region 10 and the diode region 20 of the semiconductor device 100 or the semiconductor device 101, or may be formed by implanting p-type impurity ions simultaneously when p-type impurities are ion-implanted into the IGBT region 10 or the diode region 20 of the semiconductor device 100.

Figure 12B:
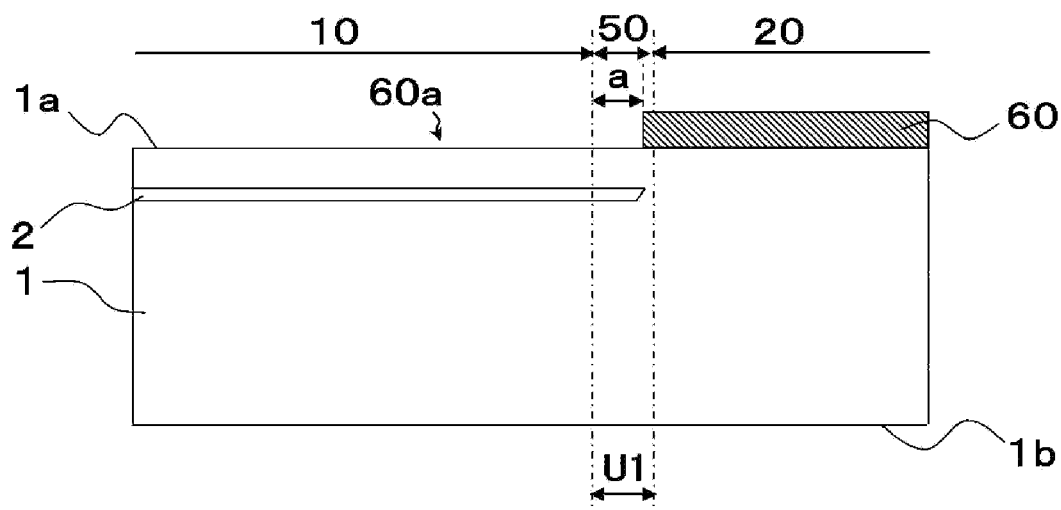

Next, as shown in FIG. 12B, a resist mask 60 being a first resist mask is formed on the first main surface 1a of the region to be the diode region 20 of the semiconductor substrate, and mask processing is performed. In the present disclosure, the mask processing is processing of applying a resist on a semiconductor substrate, forming an opening in a predetermined region of the resist using a photoengraving technique, and forming on the semiconductor substrate a mask for performing ion-implantation or etching on a predetermined region of the semiconductor substrate through the opening. As shown in FIG. 12B, the resist mask 60 has an opening 60a being a first opening in a region to be the IGBT region 10. The resist mask 60 is provided such that an end portion of the resist mask 60 protrudes from a region to be the diode region 20 to a region to be the boundary region 50 on the first main surface 1a of the semiconductor substrate. That is, the resist mask 60 has the opening 60a in the region to be the IGBT region 10 and part of the region to be the boundary region 50 on the first main surface 1a of the semiconductor substrate, and the end portion of the opening 60a of the resist mask 60 is positioned at a position away from the boundary between the region to be the IGBT region 10 and the region to be the boundary region 50 toward the diode region 20 by the distance a.

After the resist mask 60 is formed on the first main surface 1a of the semiconductor substrate, n-type impurities such as phosphorus (P) are implanted from the first main surface 1a side of the semiconductor substrate, and the n-type carrier accumulation layer 2 is formed in the IGBT region 10 and part of the boundary region 50 as shown in FIG. 12B. The n-type carrier accumulation layer 2 is formed at a position shallower than the boundary between the p-type anode layer 25 and the n⁻-type drift layer 1. As shown in FIG. 12B, the end portion of the n-type carrier accumulation layer 2 on the diode region 20 side is formed to be shallower from the first main surface 1a than the n-type carrier accumulation layer 2 of the IGBT region 10.

Figure 13A:
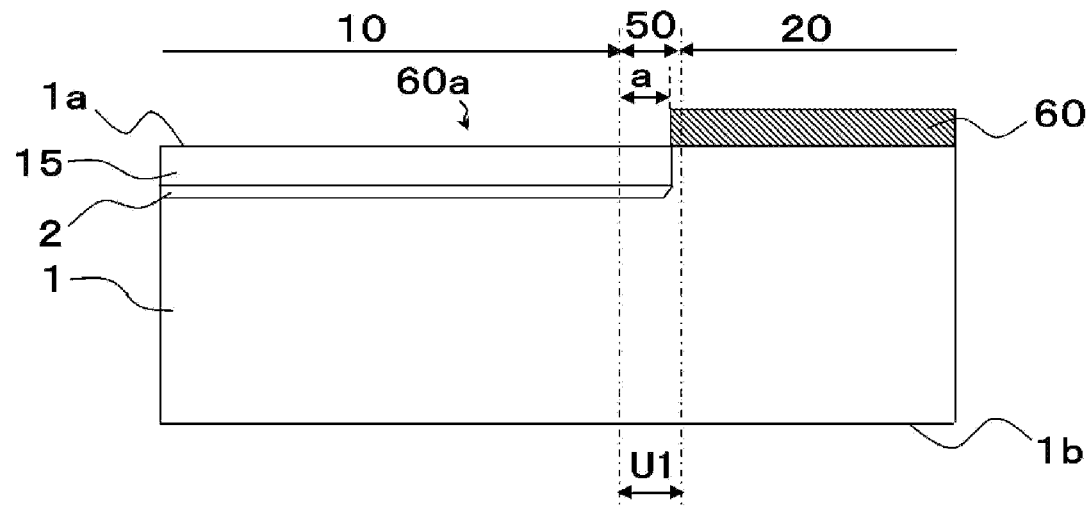

Next, as shown in FIG. 13A, p-type impurities such as boron (B) are implanted from the first main surface 1a side of the semiconductor substrate and a p-type base layer 15 is formed. Since formed by mask processing using the resist mask 60 used for forming the n-type carrier accumulation layer 2, the p-type base layer 15 is formed in the IGBT region 10 and part of the boundary region 50. Impurity ions are implanted into the IGBT region 10 and part of the boundary region 50 of the semiconductor substrate to form the n-type carrier accumulation layer 2 and the p-type base layer 15, and then heat treatment is performed on the semiconductor substrate, and the impurity ions implanted into the n-type carrier accumulation layer 2 and the p-type base layer 15 are caused to diffuse into the semiconductor substrate.

Figure 13B:
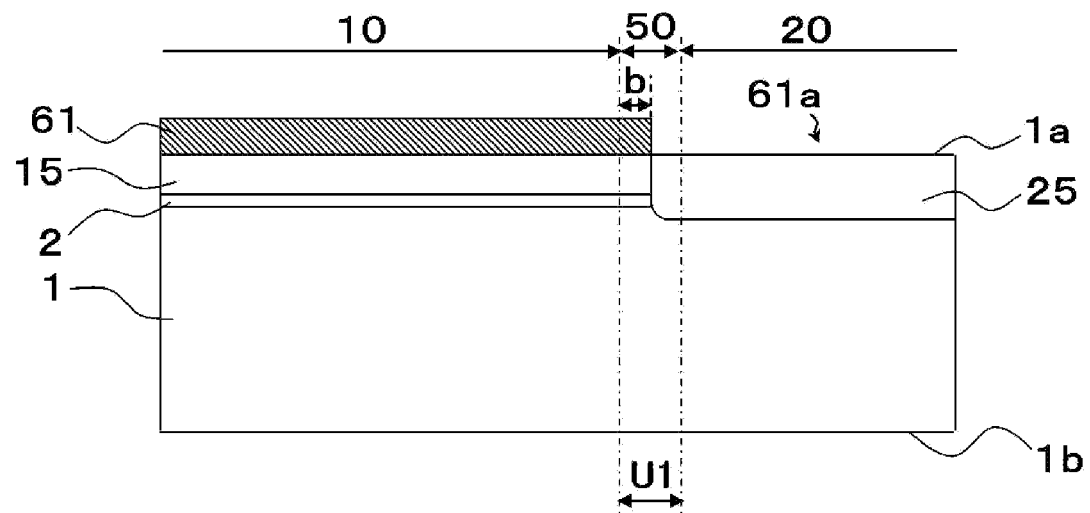

Next, as shown in FIG. 13B, a resist mask 61 being a second resist mask is formed, and mask processing is performed, on the first main surface 1a of the region to be the IGBT region 10 of the semiconductor substrate, and p-type impurity ions are implanted from the first main surface 1a side of the semiconductor substrate to form the p-type anode layer 25. As shown in FIG. 13B, the resist mask 61 has an opening 61a being a second opening in a region to be the diode region 20. The resist mask 61 is provided such that an end portion of the resist mask 61 protrudes from a region to be the IGBT region 10 by a distance b to a region to be the boundary region 50 on the first main surface 1a of the semiconductor substrate. That is, the resist mask 61 has the opening 61a in the region to be the diode region 20 and part of the region to be the boundary region 50 on the first main surface 1a of the semiconductor substrate, and the end portion of the opening 61a of the resist mask 61 is positioned at a position away from the boundary between the region to be the IGBT region 10 and the region to be the boundary region 50 toward the diode region 20 by the distance b.

The distance b shown in FIG. 13B is smaller than the distance a shown in FIG. 13A, and is set such that a portion where the depth from the first main surface 1a is shallow at the end portion on the diode region 20 side of the n-type carrier accumulation layer 2 is positioned at the opening 61a of the resist mask 61. That is, the opening 60a of the resist mask 60 and the opening 61a of the resist mask 61 are formed to partially overlap each other in the boundary region 50. Therefore, the end portion on the IGBT region 10 side of the p-type anode layer 25 is formed to overlap the region where the end portions on the diode region 20 side of the n-type carrier accumulation layer 2 and p-type base layer 15 are formed. By making the p-type impurity concentration of the p-type anode layer 25 higher than the n-type impurity concentration of the n-type carrier accumulation layer 2, a region where a region into which n-type impurity ions are implanted to form the n-type carrier accumulation layer 2 and a region into which p-type impurity ions are implanted to form the p-type anode layer 25 overlap each other becomes a p-type semiconductor layer and becomes a part of the p-type anode layer 25. As a result, the n-type carrier accumulation layer 2 and the p-type anode layer 25 can be in contact with each other in the boundary region 50. In addition, the portion where the depth from the first main surface 1a of the end portion on the diode region 20 side of the n-type carrier accumulation layer 2 becomes shallower is formed to be the p-type anode layer 25 by cancelling the n-type conductivity with the p-type impurities having concentration higher than the n-type impurity concentration of the n-type carrier accumulation layer 2, so that the concentration of the electric field on the end portion of the n-type carrier accumulation layer 2 can be suppressed, and the decrease in withstand voltage can be suppressed.

After p-type impurity ions are implanted into the diode region 20 and part of the boundary region 50 of the semiconductor substrate to form the p-type anode layer 25, heating treatment is performed on the semiconductor substrate to diffuse the impurity ions implanted into the p-type anode layer 25 into the semiconductor substrate. It should be noted that the heat treatment for diffusing impurity ions of the n-type carrier accumulation layer 2 and the p-type base layer 15 and the heat treatment for diffusing impurity ions of the p-type anode layer 25 may be performed simultaneously. By simultaneously performing heat treatment for diffusion of impurity ions in the n-type carrier accumulation layer 2, the p-type base layer 15, and the p-type anode layer 25, the number of times of diffusion of impurity ions in the n-type carrier accumulation layer 2 having an impurity concentration lower than that of the p-type base layer 15 and the p-type anode layer 25 can be reduced, and the n-type carrier accumulation layer 2 having a predetermined thickness can be easily formed.

Figure 14A:
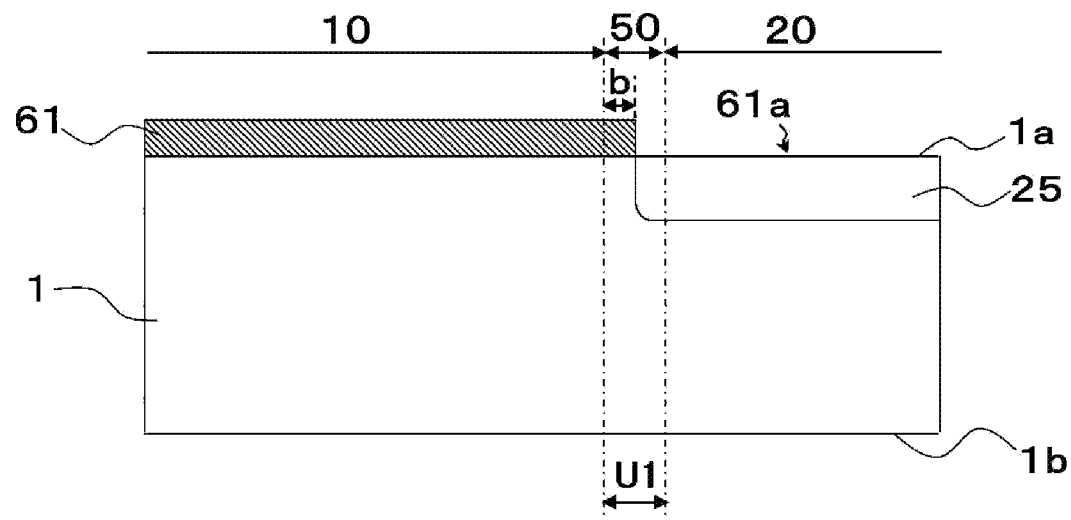
Figure 14B:
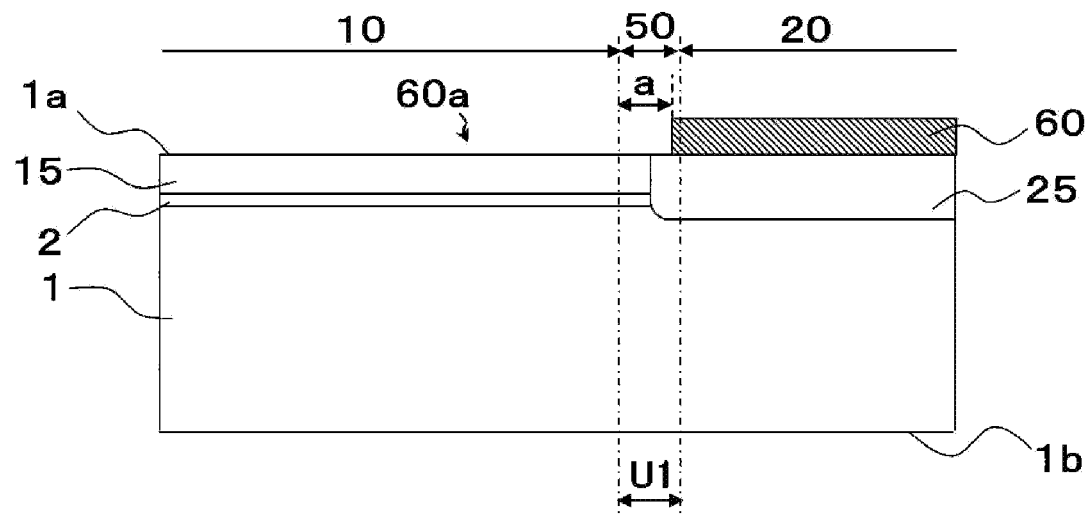

In addition, as another method for forming the n-type carrier accumulation layer 2 and the p-type anode layer 25, the p-type anode layer 25 may be formed before the n-type carrier accumulation layer 2. FIGS. 14A and 14B are diagrams showing a manufacturing method when the p-type anode layer 25 is formed before the n-type carrier accumulation layer 2. The steps shown in FIGS. 14A and 14B can be applied instead of the steps shown in FIGS. 12B, 13A, and 13B.

After the semiconductor substrate constituting the n⁻-type drift layer 1 is prepared as shown in FIG. 12A, as shown in FIG. 14A, a resist mask 61 is formed, and mask processing is performed, on the first main surface 1a of the region to be the IGBT region 10 of the semiconductor substrate, and p-type impurity ions are implanted from the first main surface 1a side of the semiconductor substrate to form the p-type anode layer 25. As in FIG. 13B, the resist mask 61 is provided such that the end portion protrudes from the region to be the IGBT region 10 by the distance b to the region to be the boundary region 50. After p-type impurity ions are implanted into the diode region 20 and a part of the boundary region 50 of the semiconductor substrate to form the p-type anode layer 25, the semiconductor substrate is subjected to heat treatment to diffuse the impurity ions implanted into the p-type anode layer 25 into the semiconductor substrate.

Next, as shown in FIG. 14B, a resist mask 60 is formed on the first main surface 1a of the region to be the diode region 20 of the semiconductor substrate, and mask processing is performed. As shown in FIG. 14B, the resist mask 60 is provided with an opening such that an end portion on the IGBT region 10 side of the p-type anode layer 25 is exposed to the first main surface 1a. The resist mask 60 has the opening in the region to be the IGBT region 10 and part of the region to be the boundary region 50 on the first main surface 1a of the semiconductor substrate, and the end portion of the opening of the resist mask 60 is positioned at a position away from the boundary between the region to be the IGBT region 10 and the region to be the boundary region 50 toward the diode region 20 by the distance a. The distance a shown in FIG. 14B is larger than the distance b shown in FIG. 14A.

After the resist mask 60 is formed on the first main surface 1a of the semiconductor substrate, n-type impurity ions are implanted from the first main surface 1a side of the semiconductor substrate to form the n-type carrier accumulation layer 2, and p-type impurity ions are implanted to form the p-type base layer 15. The n-type carrier accumulation layer 2 is formed at a position shallower than the boundary between the p-type anode layer 25 and the n⁻-type drift layer 1. Any one of the ion implantation for forming the n-type carrier accumulation layer 2 and the ion implantation for forming the p-type base layer 15 may be performed first. The n-type impurity ions for forming the n-type carrier accumulation layer 2 are also implanted into the end portion of the p-type anode layer 25 positioned in the opening of the resist mask 60, but since the p-type impurity concentration of the p-type anode layer 25 is higher than the n-type impurity concentration of the n-type carrier accumulation layer 2, even when the n-type impurity ions are implanted into the end portion of the p-type anode layer 25, the end portion of the p-type anode layer 25 maintains the p-type semiconductor layer. As a result, the n-type carrier accumulation layer 2 and the p-type anode layer 25 can be in contact with each other in the boundary region 50. In addition, since the end portion on the diode region 20 side of the n-type carrier accumulation layer 2 in which the n-type impurities are implanted only to a position shallower than the n-type carrier accumulation layer 2 in the IGBT region 10 can be embedded in the p-type anode layer 25, it is possible to suppress formation of a portion having a shallow depth from the first main surface 1a in the n-type carrier accumulation layer 2, to suppress concentration of an electric field on the end portion of the n-type carrier accumulation layer 2, and to suppress a decrease in withstand voltage.

After the n-type carrier accumulation layer 2 and the p-type base layer 15 are formed, the semiconductor substrate is heating-treated, and impurity ions implanted into the n-type carrier accumulation layer 2 and the p-type base layer 15 are diffused into the semiconductor substrate. As described above, implanting impurity ions for forming the p-type anode layer 25 prior to implanting impurity ions for forming the n-type carrier accumulation layer makes it possible for impurity ions to be diffused into the semiconductor substrate by the heat treatment only of the p-type anode layer 25, to reduce the number of times of diffusion of impurity ions by the heat treatment of the n-type carrier accumulation layer 2, and to easily form the n-type carrier accumulation layer 2 as designed.

It should be noted that the p-type termination well layer 31 formed in the termination region 30 of the semiconductor device 100 or the semiconductor device 101 may be formed by implanting p-type impurity ions simultaneously with the p-type anode layer 25. In this case, the depth and the p-type impurity concentration of the p-type termination well layer 31 and the p-type anode layer 25 are the same. In addition, in the mask processing when the p-type termination well layer 31 and the p-type anode layer 25 are formed, by changing the aperture ratio using the mask formed in the region where the p-type termination well layer 31 is formed or the region where the p-type anode layer 25 is formed as a mesh-like mask, even if p-type impurity ions are simultaneously implanted into the p-type termination well layer 31 and the p-type anode layer 25, the p-type impurity concentration of the p-type termination well layer 31 and the p-type anode layer 25 can be set to different concentrations. In addition, by separately implanting p-type impurity ions into the p-type termination well layer 31 and the p-type anode layer 25 by mask processing, depths of the p-type termination well layer 31 and the p-type anode layer 25 may be made different, or p-type impurity concentrations may be made different.

Figure 15A:
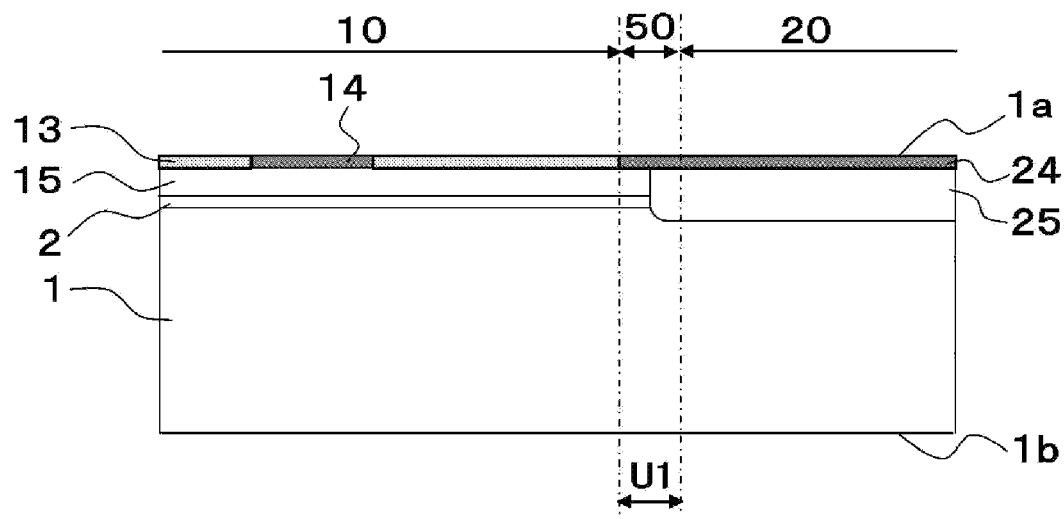

Next, as shown in FIG. 15A, n-type impurities are selectively implanted into the first main surface 1a side of the p-type base layer 15 of the IGBT region 10 by mask processing to form an $n^+$-type emitter layer 13. The n-type impurities to be implanted may be, for example, arsenic (As) or phosphorus (P). In addition, by mask processing, p-type impurities are selectively implanted into the first main surface 1a side of the p-type base layer 15 of the IGBT region 10 to form the $p^+$-type contact layer 14, and p-type impurities are selectively implanted into the first main surface 1a side of the p-type anode layer 25 of the diode region 20 to form the $p^+$-type contact layer 24. The p-type impurity to be implanted may be, for example, boron (B) or aluminum (Al).

Figure 15B:
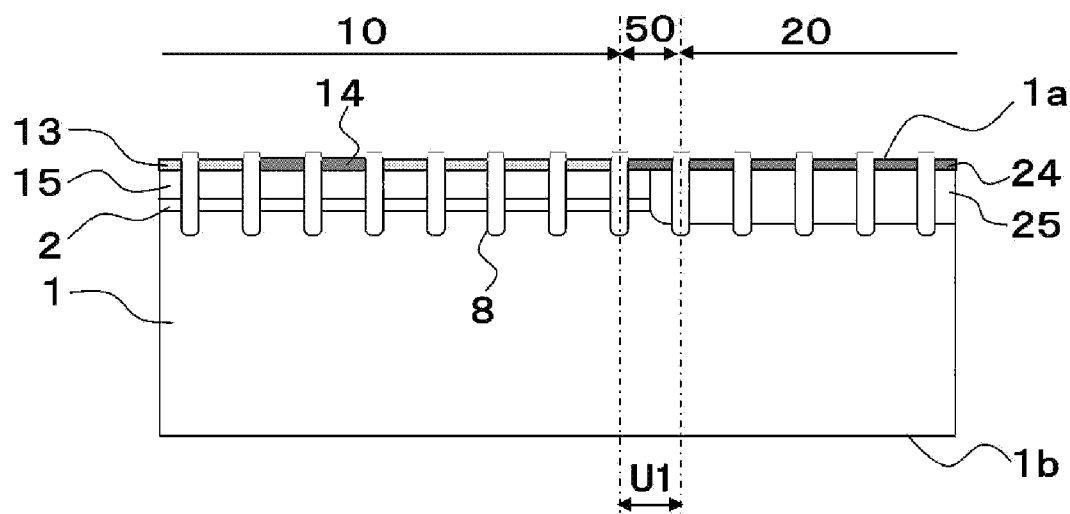

Next, as shown in FIG. 15B, a trench 8 that penetrates the p-type base layer 15 and the p-type anode layer 25 from the first main surface 1a side of the semiconductor substrate to reach the $n^-$-type drift layer 1 is formed. In FIG. 15B, the trench 8 is not formed in the boundary region 50, but one or more trenches 8 may be formed in the boundary region 50. In the IGBT region 10, the side wall of the trench 8 penetrating the $n^+$-type emitter layer 13 constitutes part of the $n^+$-type emitter layer 13. The trench 8 may be formed by depositing an oxide film such as $SiO_2$ on the semiconductor substrate, and then forming an opening in the oxide film at a portion where the trench 8 is to be formed by mask processing, and etching the semiconductor substrate using the oxide film where the opening is formed as a mask. In FIG. 15B, the trenches 8 are formed with the same pitch in the IGBT region 10 and the diode region 20, but pitches of the trenches 8 may be different between in the IGBT region 10 and in the diode region 20. The pattern of the pitch of the trenches 8 in a plan view can be appropriately changed depending on the mask pattern of the mask processing.

Figure 16A:
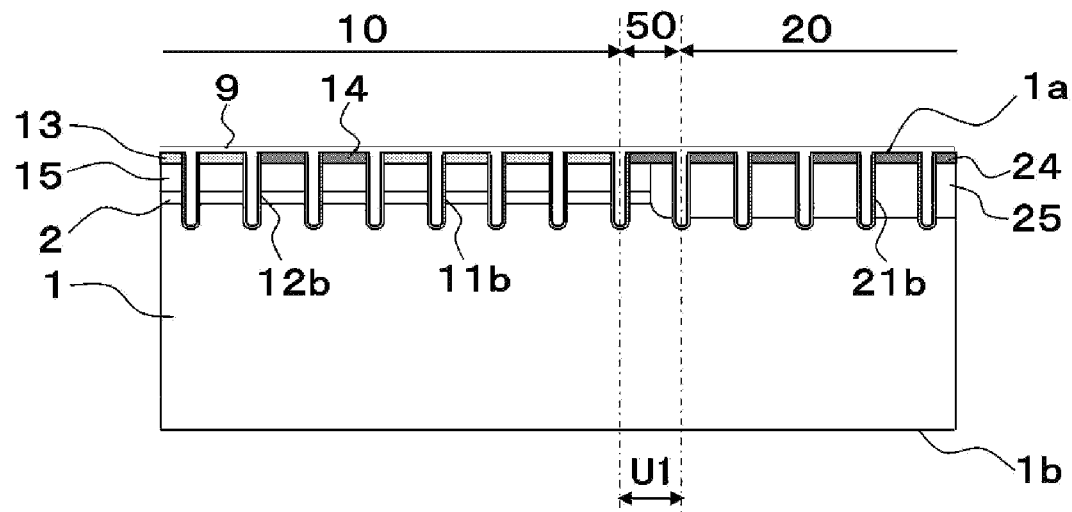

Next, as shown in FIG. 16A, the semiconductor substrate is heated in an atmosphere containing oxygen, and an oxide film 9 is formed on the inner wall of the trench 8 and the first main surface 1a of the semiconductor substrate. In the oxide film 9 formed on the inner wall of the trench 8, the oxide film 9 formed in the trench 8 of the IGBT region 10 is the gate trench insulating film 11b of the active trench gate 11 and the dummy trench insulating film 12b of the dummy trench gate 12. In addition, the oxide film 9 formed in the trench 8 of the diode region 20 is the diode trench insulating film 21b. The oxide film 9 formed on the first main surface 1a of the semiconductor substrate is removed in a later step.

Figure 16B:
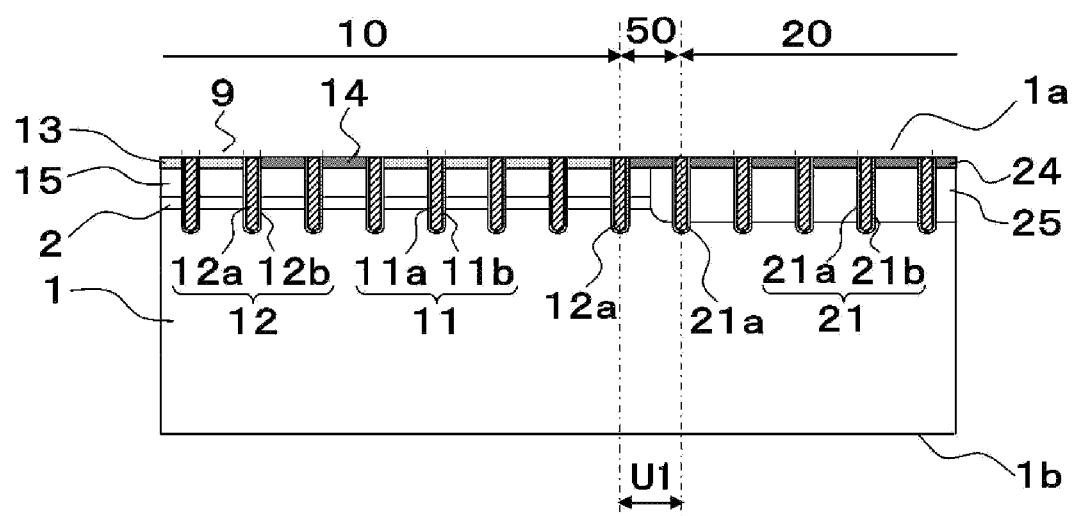

Next, as shown in FIG. 16B, polysilicon doped with n-type or p-type impurities by chemical vapor deposition (CVD) or the like is deposited in the trench 8 on whose inner wall the oxide film 9 is formed to form the gate trench electrode 11a, the dummy trench electrode 12a, and the diode trench electrode 21a.

Figure 17A:
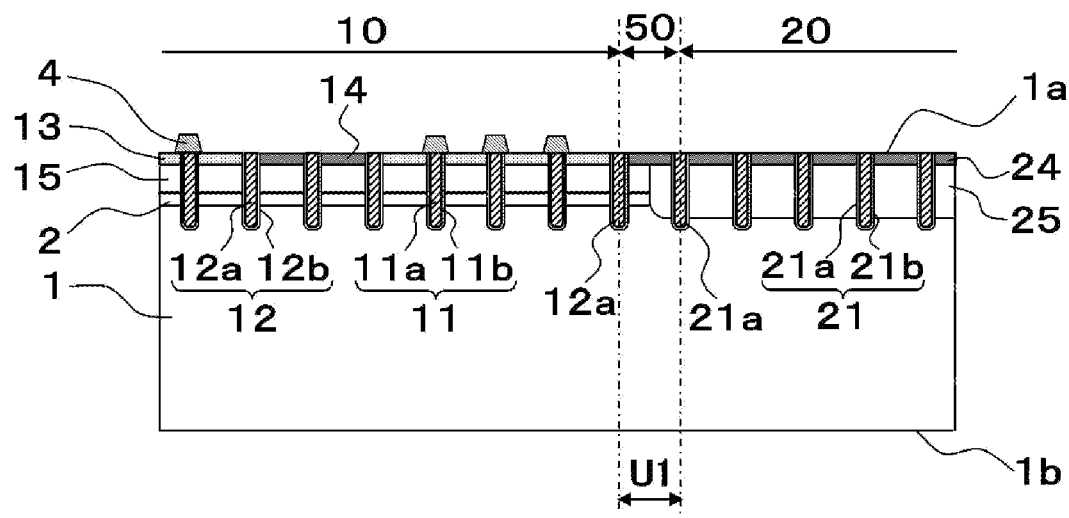

Next, as shown in FIG. 17A, after the interlayer insulating film 4 is formed on the gate trench electrode 11a of the active trench gate 11 of the IGBT region 10, the oxide film 9 formed on the first main surface 1a of the semiconductor substrate is removed. The interlayer insulating film 4 may be, for example, $SiO_2$. Then, a contact hole is formed in the interlayer insulating film 4 deposited by mask processing. The contact holes are formed on the $n^+$-type emitter layer 13, the $p^+$-type contact layer 14, the $p^+$-type contact layer 24, the dummy trench electrode 12a, and the diode trench electrode 21a.

Figure 17B:
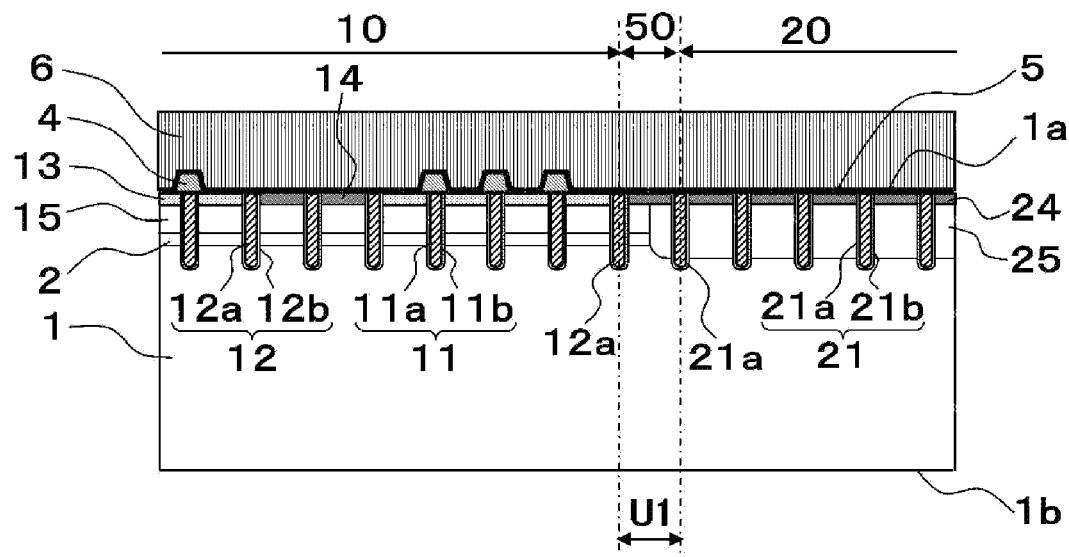
Figure 19A:
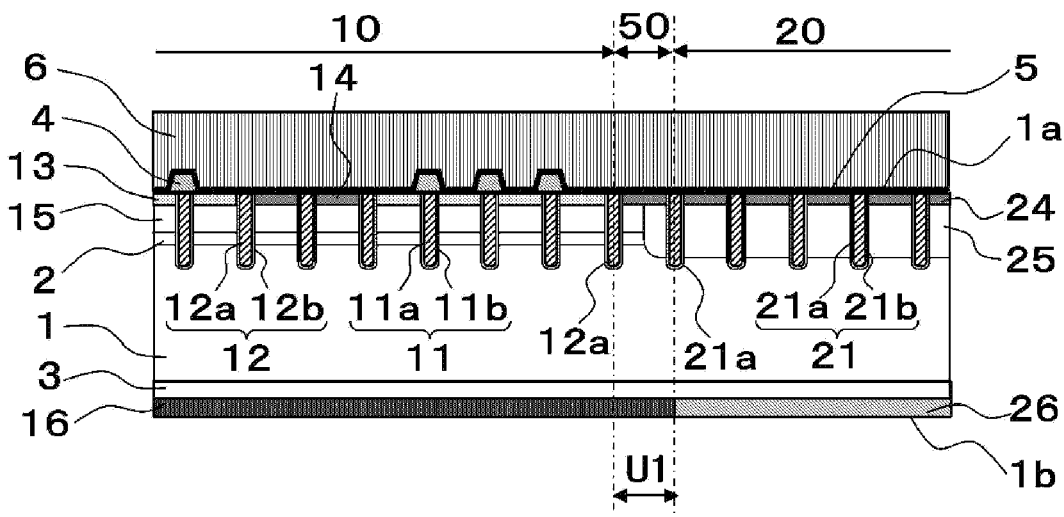
Figure 19B:
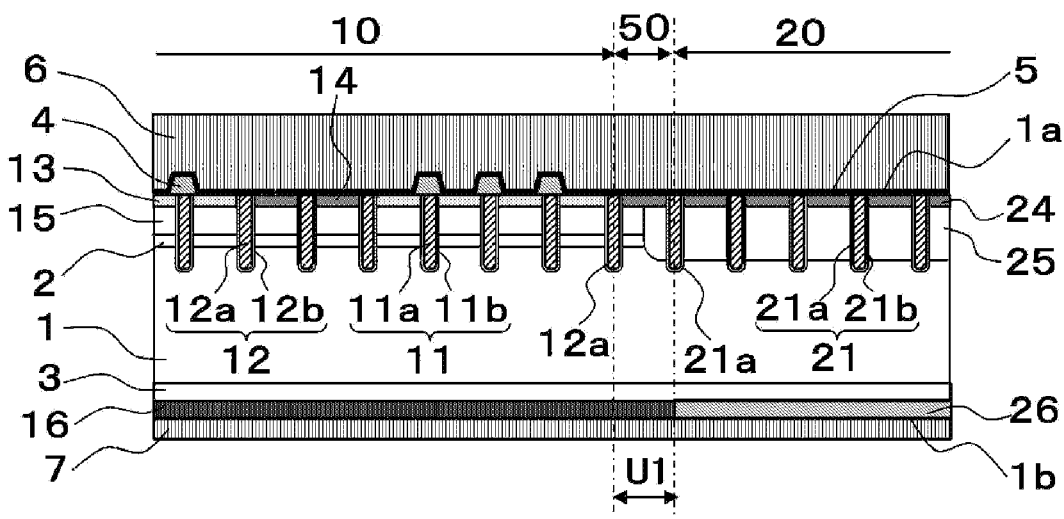

Next, as shown in FIG. 17B, a barrier metal 5 is formed on the first main surface 1a of the semiconductor substrate and the interlayer insulating film 4, and an emitter electrode 6 is further formed on the barrier metal 5. The barrier metal 5 is formed by film-forming titanium nitride by physical vapor deposition (PDV) or CVD.

The emitter electrode 6 may be formed by, for example, depositing an aluminum silicon alloy (Al—Si-based alloy) on the barrier metal 5 by PVD such as sputtering or vapor deposition. In addition, a nickel alloy (Ni alloy) or a copper alloy (Cu alloy) may be further formed on the formed aluminum silicon alloy by electroless plating or electrolytic plating to serve as the emitter electrode 6. Since forming the emitter electrode 6 by plating allows a thick metal film to be easily formed as the emitter electrode 6, heat resistance can be improved by an increase in heat capacity of the emitter electrode 6. It should be noted that when a nickel alloy or a copper alloy is further formed by plating treatment after the emitter electrode 6 made of an aluminum silicon alloy is formed by PVD, the plating treatment for forming the nickel alloy or the copper alloy may be performed after treatment on the second main surface side of the semiconductor substrate is performed.

Next, as shown in FIG. 18A, the second main surface 1b side of the semiconductor substrate is ground to thin the semiconductor substrate to a designed predetermined thickness. The thickness of the ground semiconductor substrate may be, for example, 80 μm to 200 μm.

Next, as shown in FIG. 18B, n-type impurities are implanted from the second main surface 1b side of the semiconductor substrate to form the n-type buffer layer 3. Furthermore, p-type impurities are implanted from the second main surface 1b side of the semiconductor substrate to form the p-type collector layer 16. The n-type buffer layer 3 may be formed in the IGBT region 10, the diode region 20, the boundary region 50, and the termination region 30, or may be formed only in the IGBT region 10 or the diode region 20.

The n-type buffer layer 3 may be formed by implanting phosphorus (P) ions, for example. In addition, it may be formed by implanting protons ($H^+$). Furthermore, it may be formed by implanting both protons and phosphorus. Protons can be implanted from the second main surface 1b of the semiconductor substrate to a deep position with relatively low acceleration energy. In addition, changing the acceleration energy allows the depth of proton implantation to be relatively easily changed. Therefore, when the n-type buffer layer 3 is formed of protons, performing implantation a plurality of times while changing the acceleration energy makes it possible to form the n-type buffer layer 3 wider in the thickness direction of the semiconductor substrate than that formed of phosphorus.

In addition, since phosphorus can increase the activation rate as an n-type impurity as compared with protons, punch-through of the depletion layer can be more reliably suppressed even in a semiconductor substrate thinned by forming the n-type buffer layer 3 with phosphorus. In order to further thin the semiconductor substrate, it is preferable to form the n-type buffer layer 3 by implanting both protons and phosphorus, and in this case, protons are implanted into a position deeper from the second main surface 1b than phosphorus.

The p-type collector layer 16 may be formed by implanting boron (B), for example. The p-type collector layer 16 is formed also in the termination region 30, and the p-type collector layer 16 in the termination region 30 serves as the p-type termination collector layer 16a. After boron is ion-implanted from the second main surface 1b side of the semiconductor substrate, the second main surface 1b is irradiated with a laser beam to be laser-annealed, whereby the implanted boron is activated to form the p-type collector layer 16. At this time, phosphorus for the n-type buffer layer 3 implanted into a relatively shallow position from the second main surface 1b of the semiconductor substrate is also activated at the same time. On the other hand, since protons are activated at a relatively low annealing temperature such as 350° C. to 500° C., it is necessary to take note so that the entire semiconductor substrate does not reach a temperature higher than 350° C. to 500° C. except in a step for activating protons after proton implantation. Since the laser annealing can heat only the vicinity of the second main surface 1b of the semiconductor substrate to a high temperature, the laser annealing can be used for activating n-type impurities and p-type impurities even after proton implantation.

Next, as shown in FIG. 18A, the n$^+$-type cathode layer 26 is formed in the diode region 20. The n$^+$-type cathode layer 26 may be formed by, for example, implanting phosphorus (P). As shown in FIG. 18A, phosphorus is selectively implanted from the second main surface side by mask processing so that the boundary between the p-type collector layer 16 and the n$^+$-type cathode layer 26 is positioned at a position at a distance U1 from the boundary between the IGBT region 10 and the boundary region 50 toward the diode region 20. The implantation amount of the n-type impurities for forming the n$^+$-type cathode layer 26 is larger than the implantation amount of the p-type impurities for forming the p-type collector layer 16. In FIG. 18A, the depths of the p-type collector layer 16 and the n$^+$-type cathode layer 26 from the second main surface 1b are the same, but the depth of the n$^+$-type cathode layer 26 is equal to or greater than the depth of the p-type collector layer 16. Since the region where the n$^+$-type cathode layer 26 is to be formed is required to be an n-type semiconductor by implanting n-type impurities into the region into which p-type impurities are implanted, the concentration of the implanted n-type impurities in the entire region where the n$^+$-type cathode layer 26 is to be formed is made higher than the concentration of the p-type impurities.

Next, as shown in FIG. 18B, the collector electrode 7 is formed on the second main surface 1b of the semiconductor substrate. The collector electrode 7 is formed over all surfaces of the IGBT region 10, the boundary region 50, the diode region 20, and the termination region 30 of the second main surface 1b. In addition, the collector electrode 7 may be formed over the entire second main surface 1b of the n-type wafer being a semiconductor substrate. The collector electrode 7 may be formed by depositing an aluminum silicon alloy (Ai-Si-based alloy), titanium (Ti), or the like by PVD such as sputtering or vapor deposition, or may be formed by laminating a plurality of metals such as an aluminum silicon alloy, titanium, nickel, or gold. Furthermore, a metal film may be further formed on the metal film formed by PVD by electroless plating or electrolytic plating to be the collector electrode 7.

The semiconductor device 100 or the semiconductor device 101 is manufactured by the above steps. Since a plurality of semiconductor devices 100 or 101 are to be manufactured in a matrix shape on one n-type wafer, dividing the n-type wafer into individual semiconductor devices 100 or 101 by laser dicing or blade dicing completes the semiconductor devices 100 or 101.

As described above, in the semiconductor device 100 or the semiconductor device 101 of the present disclosure, since the depth from the first main surface 1a of the semiconductor substrate of the p-type anode layer 25 in the diode region 20 is made larger than the depth from the first main surface 1a of the n-type carrier accumulation layer 2 provided in the IGBT region 10, the concentration of the electric field on the n-type carrier accumulation layer 2 is suppressed, so that the decrease in the withstand voltage of the semiconductor device 100 or the semiconductor device 101 can be suppressed.

In addition, the p-type impurity concentration of the p-type anode layer 25 is made higher than the n-type impurity concentration of the n-type carrier accumulation layer 2, and the p-type anode layer 25 is formed so as to overlap the portion where the depth from the first main surface 1a becomes shallow at the end portion on the diode region 20 side of the n-type carrier accumulation layer 2 formed in the IGBT region 10. Therefore, the portion where the depth from the first main surface 1a becomes shallow at the end portion of the n-type carrier accumulation layer 2 can be eliminated, the electric field concentration on the n-type carrier accumulation layer 2 can be suppressed, and the decrease in withstand voltage can be suppressed.

In addition, since the boundary region 50 is provided between the IGBT region 10 and the diode region 20, and the n-type carrier accumulation layer 2 and the p-type anode layer 25 are in contact with each other at the boundary region 50, the boundary between the n-type carrier accumulation layer 2 and the p-type anode layer 25 can be provided separated from the trench electrode where the electric field is likely to be concentrated, so that it is possible to suppress the concentration of the electric field on the end portion on the diode region 20 side of the n-type carrier accumulation layer 2 and suppress the decrease in the withstand voltage.

In addition, since the boundary between the n-type carrier accumulation layer 2 and the p-type anode layer 25 is positioned between the two trench electrodes electrically connected to the emitter electrode 6, it is possible to suppress the influence of the boundary between the n-type carrier accumulation layer 2 and the p-type anode layer 25 on the switching operation of the semiconductor device 100 or the semiconductor device 101 and to suppress a decrease in withstand voltage.

In addition, since one or more boundary trench electrodes 51a are provided in the boundary region 50 and the boundary between the n-type carrier accumulation layer 2 and the p-type anode layer 25 is provided in the boundary region 50, the width of the boundary region 50 that does not contribute to the switching operation of the semiconductor device 100 or the semiconductor device 101 is increased, the influence of the boundary between the n-type carrier accumulation layer 2 and the p-type anode layer 25 on the switching operation can be further suppressed, and the decrease in withstand voltage can be suppressed.

Second Preferred Embodiment

Figure 20:
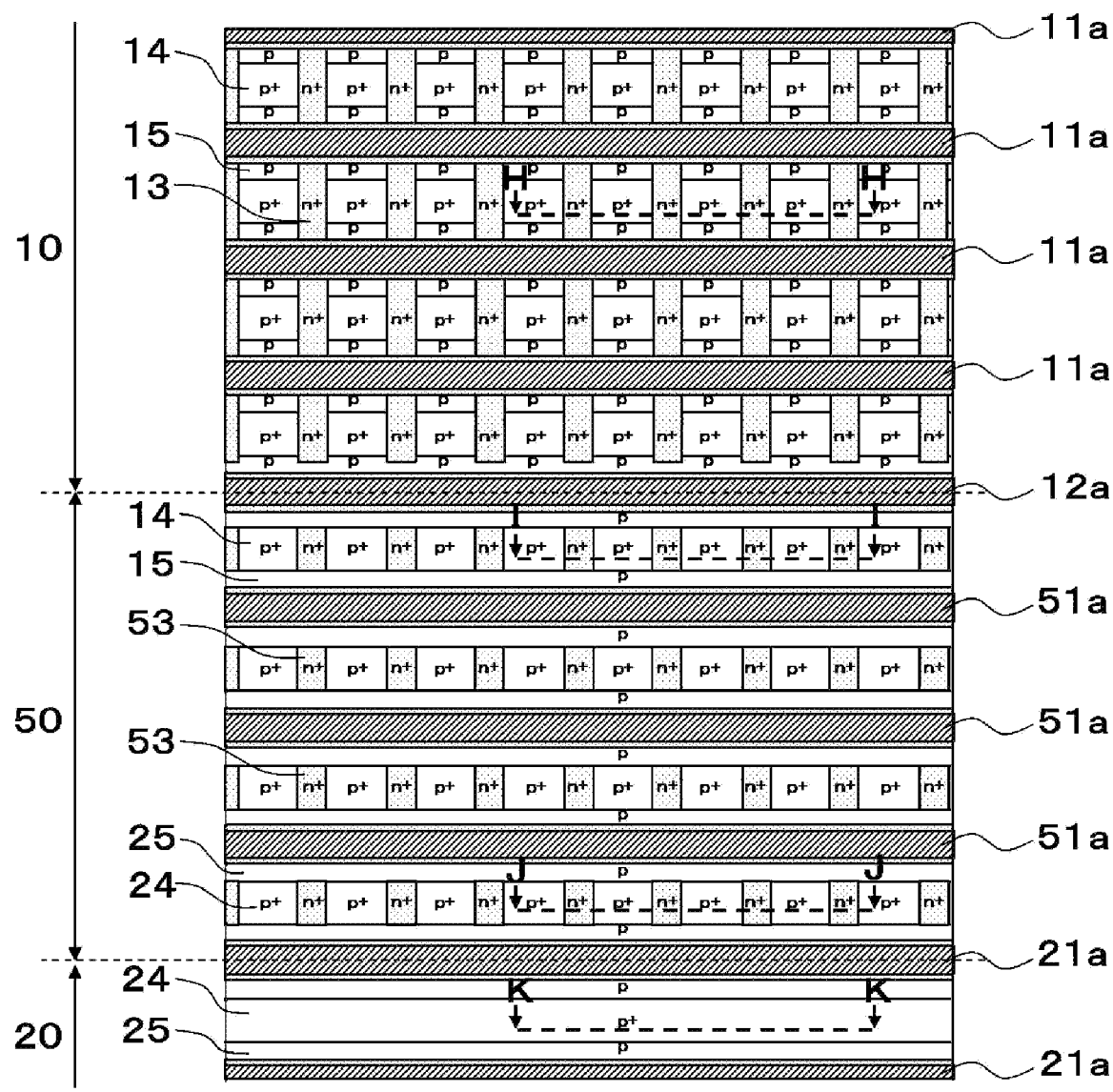
FIG. 20 is a partially enlarged plan view showing a configuration of a boundary portion between an IGBT region and a diode region of a semiconductor device according to a second preferred embodiment.

Next, a configuration of a semiconductor device according to a second preferred embodiment will be described. FIG. 20 is a partially enlarged plan view showing a configuration of a boundary portion between an IGBT region and a diode region of a semiconductor device being an RC-IGBT according to the second preferred embodiment. FIG. 20 is an enlarged view of another configuration of a region surrounded by a broken line 84 in the semiconductor device having the configuration shown in FIG. 1 or 2. In the second preferred embodiment, a configuration identical or corresponding to the semiconductor device 100 or the semiconductor device 101 described in the first preferred embodiment is denoted by the reference numeral identical to that in the first preferred embodiment, and description thereof will be omitted.

As shown in FIG. 20, the semiconductor device according to the second preferred embodiment includes a boundary region 50 between the IGBT region 10 and the diode region 20, and a plurality of boundary trench electrodes 51a are provided in the boundary region 50. The boundary region 50 is provided between the dummy trench electrode 12a being the IGBT electrode closest to the diode region 20 in the IGBT region 10, and the diode trench electrode 21a closest to the IGBT region 10 in the diode region 20.

The p$^+$-type contact layer 14 provided on the first main surface 1a side of the IGBT region 10 is different from that of the semiconductor device 100 or the semiconductor device 101 of the first preferred embodiment, and is sandwiched between the p-type base layers 15 in a region sandwiched between the IGBT electrodes including the gate trench electrodes 11a or the dummy trench electrodes 12a. In addition, the n$^+$-type emitter layer 13 closest to the diode region 20 in the IGBT region 10 is not in contact with the IGBT trench electrode with the interposition of the insulating film at the end portion on the diode region 20 side, and the p-type base layer 15 is provided between the n$^+$-type emitter layer 13 and the dummy trench electrode 12a being the IGBT trench electrode. In addition, the p$^+$-type contact layer 24 provided on the first main surface 1a side of the diode region 20 is different from that of the semiconductor device 100 or the semiconductor device 101 of the first preferred embodiment, and is sandwiched between the p-type anode layers 25 in a region sandwiched between the diode trench electrodes 21a.

It should be noted that the arrangement of the p$^+$-type contact layer 14, the p-type base layer 15, the p$^+$-type contact layer 24, and the p-type anode layer 25 in the IGBT region 10 and the diode region 20 shown in FIG. 20 is not limited thereto, and may be the arrangement shown in FIG. 3 or 6 of the first preferred embodiment. In the semiconductor device 100 or the semiconductor device 101 of the first preferred embodiment, the arrangement of the p$^+$-type contact layer 14, the p-type base layer 15, the p$^+$-type contact layer 24, and the p-type anode layer 25 in the IGBT region 10 and the diode region 20 may be the arrangement as shown in FIG. 20.

As shown in FIG. 20, in the boundary region 50, the p-type base layer 15 or the p-type anode layer 25 faces the boundary trench electrode 51a with the interposition of the insulating film. FIG. 20 shows a configuration in which the boundary trench electrode 51a closest to the IGBT region 10 faces the p-type base layer 15 with the interposition of the insulating film, and the boundary trench electrode 51a closest to the diode region 20 faces the p-type anode layer 25 with the interposition of the insulating film, and the boundary between the p-type base layer 15 and the p-type anode layer 25 is positioned in the boundary region 50 (not shown). Since the n-type carrier accumulation layer 2 is provided between the p-type base layer 15 and the n$^-$-type drift layer 1, a boundary between the n-type carrier accumulation layer 2 and the p-type anode layer 25 is also positioned in the boundary region 50 (not shown).

As shown in FIG. 20, in the semiconductor device according to the second preferred embodiment, an n$^+$-type carrier injection suppression layer 53 having a higher n-type impurity concentration than the n-type carrier accumulation layer 2 is selectively provided in a surface layer portion of the p-type base layer 15 or the p-type anode layer 25 included in the boundary region 50. The n-type impurity concentration of the n$^+$-type carrier injection suppression layer 53 may be the same as the n-type impurity concentration of the n$^+$-type emitter layer 13 of the IGBT region 10, and may be higher or lower than the n-type impurity concentration of the n$^+$-type emitter layer 13. In addition, in FIG. 20, the n$^+$-type emitter layer 13 and the n$^+$-type carrier injection suppression layer 53 are provided to face each other in the direction in which the IGBT region 10 and the diode region 20 are side by side (up-down direction on the paper surface), but the n$^+$-type carrier injection suppression layer 53 may be provided regardless of the arrangement of the n$^+$-type emitter layer 13. That is, in FIG. 20, the number of n$^+$-type emitter layers 13 and the number of n$^+$-type carrier injection suppression layers 53 provided in the longitudinal direction (left-right direction on the paper surface) of the gate trench electrode 11a and the boundary trench electrode 51a are the same, but the number of n$^+$-type emitter layers 13 and the number of n$^+$-type carrier injection suppression layers 53 may be different.

As shown in FIG. 20, the n$^+$-type carrier injection suppression layer 53 provided in the boundary region 50 is arranged to be sandwiched between the p-type base layers 15 or the p-type anode layers 25 in the direction in which the IGBT region 10 and the diode region 20 are side by side (up-down direction on the paper surface). That is, the n$^+$-type carrier injection suppression layer 53 is not in contact with the insulating film provided in contact with the boundary trench electrode 51a, and faces the trench in which the boundary trench electrode 51a is provided with the interposition of the p-type base layer 15 or the p-type anode layer 25.

In the semiconductor device of the second preferred embodiment shown in FIG. 20, the p$^+$-type contact layer 14 or the p$^+$-type contact layer 24 is provided between the n$^+$-type carrier injection suppression layers 53 adjacent to each other in the extending direction of the boundary trench electrode 51a, but the p$^+$-type contact layer 14 or the n$^+$-type contact layer 24 is not necessarily provided, and the p-type base layer 15 or the p-type anode layer 25 may be provided instead of the p$^+$-type contact layer 14 or the p$^+$-type contact layer 24. In addition, the p-type base layer 15 or the p-type anode layer 25 is provided between the n$^+$-type carrier injection suppression layer 53 and the trench provided with the boundary trench electrode 51a, but the p$^+$-type contact layer 14 or the p$^+$-type contact layer 24 may be provided instead of the p-type base layer 15 or the p-type anode layer 25.

Figure 21:
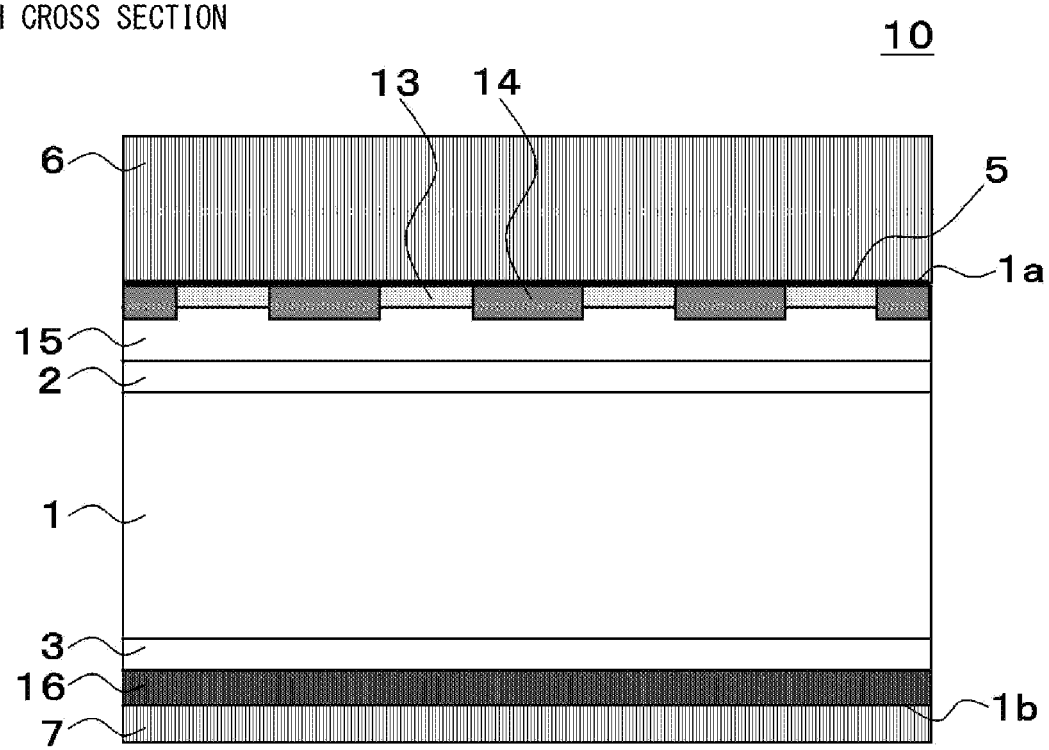
FIGS. 21 to 24 are cross-sectional views each showing a configuration of an IGBT region, a boundary region, and a diode region of a semiconductor device according to the second preferred embodiment.
Figure 22:
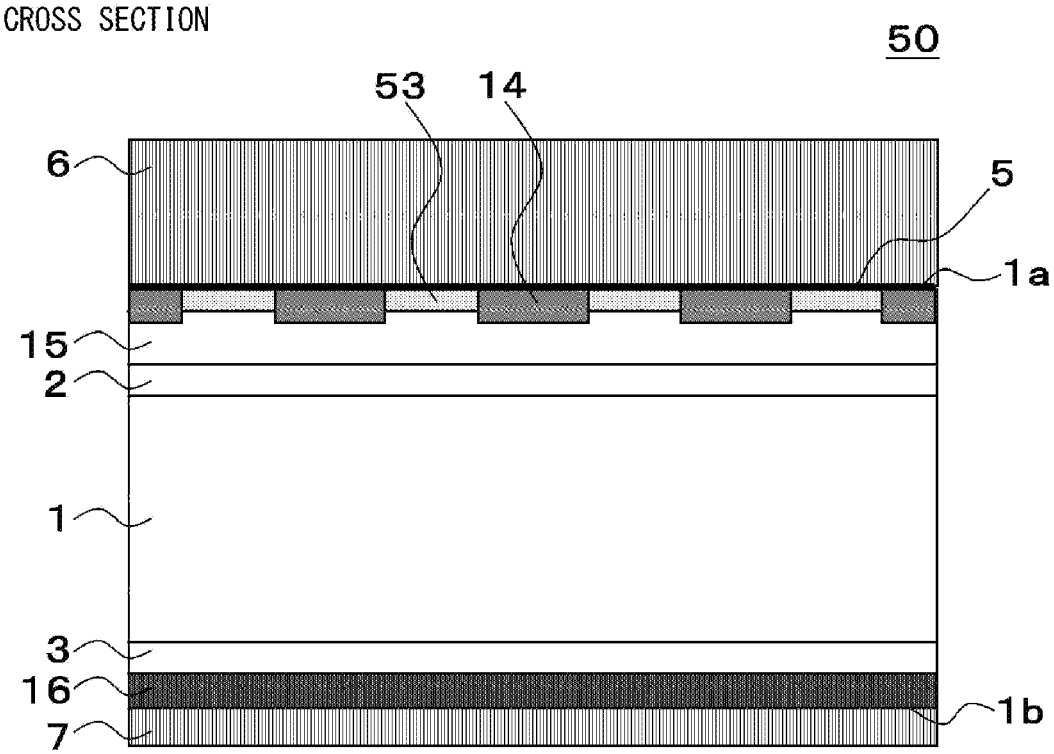
Figure 23:
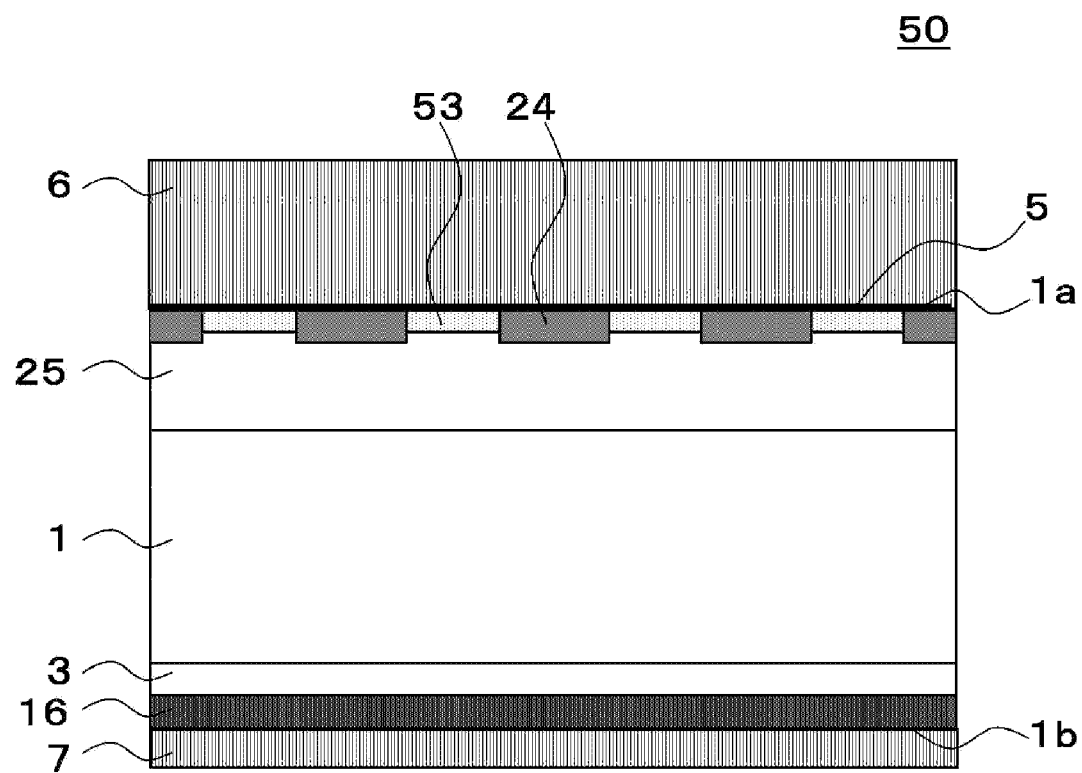
Figure 24:
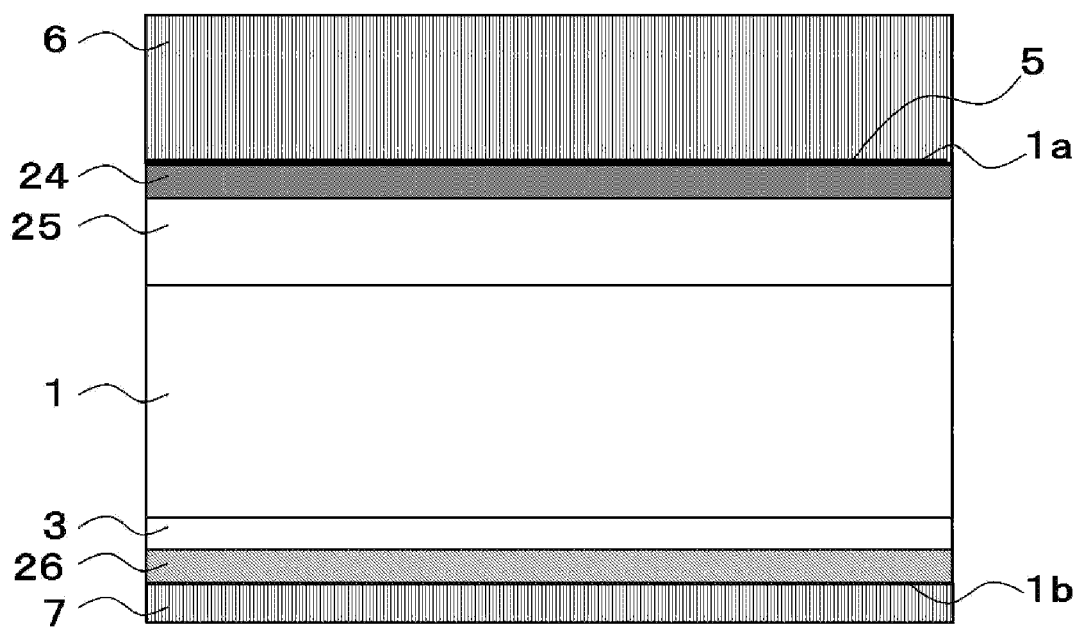

FIGS. 21 to 24 are cross-sectional views showing configurations of an IGBT region, a boundary region, and a diode region of a semiconductor device being the RC-IGBT according to the second preferred embodiment. FIG. 21 is a cross-sectional view of the IGBT region 10 taken along a broken line H-H shown in FIG. 20. FIG. 22 is a cross-sectional view in the boundary region 50 taken along a broken line I-I in FIG. 20. FIG. 23 is a cross-sectional view in the boundary region 50 taken along a broken line J-J shown in FIG. 20. FIG. 24 is a cross-sectional view in the diode region 20 taken along a broken line K-K shown in FIG. 20. Each of FIGS. 21 to 24 is a cross-sectional view in a direction orthogonal to the direction in which the IGBT region 10 and the diode region 20 are side by side (up-down direction on the paper surface), and is a cross-sectional view in a direction orthogonal to the extending direction of the gate trench electrode 11$a$, the dummy trench electrode 12$a$, and the boundary trench electrode 51$a$.

As shown in FIG. 21, in the IGBT region 10, a p-type base layer 15 is provided on the first main surface 1$a$ side of the semiconductor substrate, and an n$^+$-type emitter layer 13 and a p$^+$-type contact layer 14 are selectively provided in a surface layer portion of the p-type base layer 15. The p$^+$-type contact layer 14 may be provided up to a position deeper from the first main surface 1$a$ than the n$^+$-type emitter layer 13. An n-type carrier accumulation layer 2 is provided between the p-type base layer 15 and the n$^-$-type drift layer 1. In addition, the n-type buffer layer 3 is provided on the second main surface 1$b$ side of the n$^-$-type drift layer 1, and the p-type collector layer 16 is provided between the n-type buffer layer 3 and the second main surface 1$b$.

As shown in FIGS. 22 and 23, in the boundary region 50, the p-type base layer 15 is provided on the first main surface 1$a$ side of the semiconductor substrate in a region close to the IGBT region 10, and the p-type anode layer 25 is provided on the first main surface 1$a$ side of the semiconductor substrate in a region close to the diode region 20. In addition, in a region where the p-type base layer 15 is provided in the boundary region 50, the n-type carrier accumulation layer 2 is provided between the p-type base layer 15 and the n$^-$-type drift layer 1.

As described in the first preferred embodiment, the p-type base layer 15 in the boundary region 50 is a p-type semiconductor layer continuous from the p-type base layer 15 in the IGBT region 10, the n-type carrier accumulation layer 2 in the boundary region 50 is an n-type semiconductor layer continuous from the n-type carrier accumulation layer 2 in the IGBT region 10, and the p-type anode layer 25 in the boundary region 50 is a p-type semiconductor layer continuous from the p-type anode layer 25 in the diode region 20. The n-type carrier accumulation layer 2 provided in the IGBT region 10 and the boundary region 50 is provided at a position shallower from the first main surface 1$a$ of the semiconductor substrate than the boundary between the p-type anode layer 25 and the n$^-$-type drift layer 1 provided in the diode region 20 and the boundary region 50. Although not shown in FIGS. 22 and 23, the n-type carrier accumulation layer 2 and the p-type anode layer 25 are in contact with each other at the boundary region 50 as described in the first preferred embodiment.

As shown in FIGS. 22 and 23, in the boundary region 50, the n$^+$-type carrier injection suppression layer 53 having a higher n-type impurity concentration than the n-type carrier accumulation layer 2 is selectively provided in the surface layer portion of the p-type base layer 15 or the p-type anode layer 25. A p$^+$-type contact layer 14 or a p$^+$-type contact layer 24 is provided between the n$^+$-type carrier injection suppression layers 53 adjacent to each other. The p$^+$-type contact layer 14 or the p$^+$-type contact layer 24 may be provided up to a position deeper from the first main surface 1$a$ than the n$^+$-type carrier injection suppression layer 53. It should be noted that the p$^+$-type contact layer 14 or the p$^+$-type contact layer 24 is not necessarily required to be provided, and the p-type base layer 15 or the p-type anode layer 25 may be provided instead of the p$^+$-type contact layer 14 or the p$^+$-type contact layer 24. In the boundary region 50, the n-type buffer layer 3 is provided on the second main surface 1$b$ side of the semiconductor substrate, and the p-type collector layer 16 is provided between the n-type buffer layer 3 and the second main surface 1$b$.

As shown in FIG. 24, in the diode region 20, a p-type anode layer 25 is provided on the first main surface 1$a$ side of the semiconductor substrate, and a p$^+$-type contact layer 24 is provided in a surface layer portion of the p-type anode layer 25. The p$^+$-type contact layer 24 may be selectively provided in a surface layer portion of the p-type anode layer 25. The p-type anode layer 25 is in contact with the n$^-$-type drift layer 1, and the boundary between the p-type anode layer 25 and the n$^-$-type drift layer 1 is provided at a position deeper than the depth at which the n-type carrier accumulation layer 2 is provided. In addition, an n-type buffer layer 3 is provided on the second main surface 1$b$ side of the n$^-$-type drift layer 1, and an n$^+$-type cathode layer 26 is provided between the n-type buffer layer 3 and the second main surface 1$b$.

The semiconductor device of the second preferred embodiment is configured as described above. In the semiconductor device of the second preferred embodiment, since the n$^+$-type carrier injection suppression layer 53 is provided in the surface layer portion of the p-type base layer 15 or the p-type anode layer 25 in the boundary region 50, the supply amount of holes from the first main surface 1$a$ side of the boundary region 50 decreases, so that the injection efficiency of holes into the diode region 20 decreases. Therefore, it is possible to reduce recovery loss during diode operation while suppressing a decrease in withstand voltage of the semiconductor device.

Third Preferred Embodiment

Figure 25:
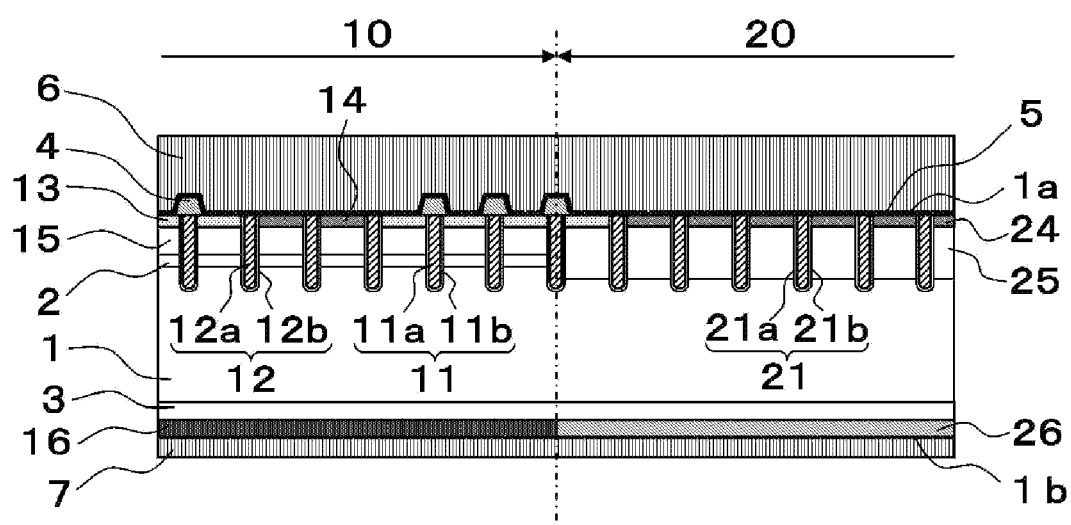
FIG. 25 is a cross-sectional view showing a configuration of a boundary between an IGBT region and a diode region of the semiconductor device according to a third preferred embodiment.

FIG. 25 is a cross-sectional view showing a configuration of a boundary between an IGBT region and a diode region of a semiconductor device being an RC-IGBT according to the third preferred embodiment. FIG. 25 is a cross-sectional view taken along a broken line G-G in the semiconductor device 100 shown in FIG. 1 or the semiconductor device 101 shown in FIG. 2, and is a cross-sectional view of the semiconductor device having a configuration not including the boundary region 50 between the IGBT region 10 and the diode region 20 unlike the cross-sectional view shown in FIG. 9 or 10 described in the first preferred embodiment.

As shown in FIG. 25, in the semiconductor device according to the third preferred embodiment, the IGBT region 10 and the diode region 20 are provided adjacent to each other, and the gate trench electrode 11$a$ being an IGBT trench electrode is provided at the boundary between the IGBT region 10 and the diode region 20. In FIG. 25, the IGBT trench electrode provided at the boundary between the IGBT region 10 and the diode region 20 is the gate trench electrode 11$a$, but may be the dummy trench electrode 12$a$.

In the semiconductor device of the third preferred embodiment, as with the semiconductor device 100 or the semiconductor device 101 described in the first preferred embodiment, the n-type carrier accumulation layer 2 is provided in the IGBT region 10, and the n-type carrier accumulation layer 2 is provided at a position shallower from the first main surface 1a than the boundary between the p-type anode layer 25 and the n⁻-type drift layer 1 provided in the diode region 20. That is, the p-type anode layer 25 is provided up to a position deeper from the first main surface 1a of the semiconductor substrate than the boundary between the n-type carrier accumulation layer 2 and the n⁻-type drift layer 1 provided in the IGBT region 10.

In the semiconductor device of the third preferred embodiment, as with the semiconductor device described in the first preferred embodiment, since the depth from the first main surface 1a of the semiconductor substrate of the p-type anode layer 25 of the diode region 20 is made larger than the depth from the first main surface 1a of the n-type carrier accumulation layer 2 provided in the IGBT region 10, the concentration of the electric field on the n-type carrier accumulation layer 2 is suppressed, so that a decrease in withstand voltage of the semiconductor device can be suppressed.

It should be noted that in the above first to third preferred embodiments, the trench type semiconductor device in which a trench is formed in the IGBT region 10 and the diode region 20 of the semiconductor device and an electrode is provided in the trench with the interposition of the insulating film has been described, but the semiconductor device of the present disclosure may be a planer type semiconductor device in which the trench is not formed and the electrode is provided on the first main surface 1a of the semiconductor substrate with the interposition of the insulating film. In addition, the semiconductor device may be a semiconductor device in which a trench is formed only in the IGBT region 10 and no trench is formed in the diode region 20 or the boundary region 50.

It should be noted that appropriately combining, modifying, or omitting each preferred embodiment is also included in the scope of the present disclosure.

While the disclosure has been shown and described in detail, the foregoing description is in all aspects illustrative and not restrictive. It is therefore understood that numerous modifications and variations can be devised.

What is claimed is:

1. A semiconductor device comprising:
an IGBT region; and
a diode region,
wherein the IGBT region and the diode region are included in a semiconductor substrate including a drift layer of a first conductivity type between a first main surface and a second main surface facing the first main surface,
wherein the IGBT region and the diode region are provided side by side in a first direction along the first main surface,
wherein the IGBT region includes:
a collector layer of a second conductivity type provided between the drift layer and the second main surface,
a carrier accumulation layer of a first conductivity type provided in contact with the drift layer on the first main surface side of the drift layer and having a higher impurity concentration of a first conductivity type than the drift layer,
a base layer of a second conductivity type provided between the carrier accumulation layer and the first main surface,
an emitter layer of a first conductivity type selectively provided in a surface layer portion of the base layer and having a part of the first main surface, and
a gate electrode provided to face the emitter layer and the base layer with an interposition of an insulating film, and
wherein the diode region includes:
a cathode layer of a first conductivity type provided between the drift layer and the second main surface,
an anode layer of a second conductivity type provided between the drift layer and the first main surface, a depth from the first main surface to a boundary between the anode layer and the drift layer being larger than a depth from the first main surface to a boundary between the carrier accumulation layer and the drift layer; and
a plurality of diode trench electrodes provided in trenches penetrating the anode layer from the first main surface to reach the drift layer,
wherein the collector layer and the cathode layer are provided side by side in the first direction.

2. The semiconductor device according to claim 1, wherein an impurity concentration of a second conductivity type of the anode layer is higher than an impurity concentration of a first conductivity type of the carrier accumulation layer.

3. The semiconductor device according to claim 1,
wherein the IGBT region includes a plurality of IGBT trench electrodes extending in a second direction orthogonal to the first direction along the first main surface and provided with an interposition of an insulating film in trenches penetrating the base layer from the first main surface to reach the drift layer,
wherein the plurality of diode trench electrodes extend in the second direction and are provided with an interposition of an insulating film in the trenches penetrating the anode layer from the first main surface to reach the drift layer, and
wherein at least some of the plurality of IGBT trench electrodes are the gate electrode.

4. The semiconductor device according to claim 1, wherein the depth from the first main surface to the boundary between the anode layer and the drift layer is larger than the depth from the first main surface to a boundary between the carrier accumulation layer and the drift layer at a position directly above the cathode layer.

5. A semiconductor device comprising:
an IGBT region; and
a diode region,
wherein the IGBT region and the diode region are included in a semiconductor substrate including a drift layer of a first conductivity type between a first main surface and a second main surface facing the first main surface,
wherein the IGBT region and the diode region are provided side by side in a first direction along the first main surface,
wherein the IGBT region includes:
a collector layer of a second conductivity type provided between the drift layer and the second main surface,
a carrier accumulation layer of a first conductivity type provided in contact with the drift layer on the first main surface side of the drift layer and having a higher impurity concentration of a first conductivity type than the drift layer, a base layer of a second conductivity type provided between the carrier accumulation layer and the first main surface, an emitter layer of a first conductivity type selectively provided in a surface layer portion of the base layer and having a part of the first main surface, and a gate electrode provided to face the emitter layer and the base layer with an interposition of an insulating film, and wherein the diode region includes:

a cathode layer of a first conductivity type provided between the drift layer and the second main surface, an anode layer of a second conductivity type provided between the drift layer and the first main surface, a depth from the first main surface to a boundary between the anode layer and the drift layer being larger than a depth from the first main surface to a boundary between the carrier accumulation layer and the drift layer; and a plurality of diode trench electrodes provided in trenches penetrating the anode layer from the first main surface to reach the drift layer, wherein the IGBT region includes a plurality of IGBT trench electrodes extending in a second direction orthogonal to the first direction along the first main surface and provided with an interposition of an insulating film in trenches penetrating the base layer from the first main surface to reach the drift layer, wherein the plurality of diode trench electrodes extend in the second direction and are provided with an interposition of an insulating film in the trenches penetrating the anode layer from the first main surface to reach the drift layer, and wherein at least some of the plurality of IGBT trench electrodes are the gate electrode, the semiconductor device further comprising a boundary region including the drift layer between the IGBT trench electrode closest to the diode region among the plurality of IGBT trench electrodes and the diode trench electrode closest to the IGBT region among the plurality of diode trench electrodes, wherein the boundary region includes the collector layer between the drift layer and the second main surface, and wherein the carrier accumulation layer and the anode layer are in contact with each other at the boundary region.

6. The semiconductor device according to claim 5, further comprising an emitter electrode electrically connected to the emitter layer, the base layer, and the anode layer on the first main surface, and wherein the IGBT trench electrode closest to the diode region and the diode trench electrode closest to the IGBT region are electrically connected to the emitter electrode.

7. The semiconductor device according to claim 6, wherein the boundary region includes a boundary trench electrode provided with an interposition of an insulating film in a trench extending in the second direction and reaching the drift layer from the first main surface, and wherein the boundary trench electrode is electrically connected to the emitter electrode.

8. The semiconductor device according to claim 5, wherein the boundary region includes the base layer or the anode layer between the drift layer and the first main surface, and further comprising a carrier injection suppression layer of a first conductivity type having a higher impurity concentration of a first conductivity type than the carrier accumulation layer selectively provided in a surface layer portion of the base layer or the anode layer included in the boundary region.

9. A semiconductor device comprising:

an IGBT region; and a diode region, wherein the IGBT region and the diode region are included in a semiconductor substrate including a drift layer of a first conductivity type between a first main surface and a second main surface facing the first main surface, wherein the IGBT region and the diode region are provided side by side in a first direction along the first main surface, wherein the IGBT region includes:

a collector layer of a second conductivity type provided between the drift layer and the second main surface, a carrier accumulation layer of a first conductivity type provided in contact with the drift layer on the first main surface side of the drift layer and having a higher impurity concentration of a first conductivity type than the drift layer, a base layer of a second conductivity type provided between the carrier accumulation layer and the first main surface, an emitter layer of a first conductivity type selectively provided in a surface layer portion of the base layer and having a part of the first main surface, and a gate electrode provided to face the emitter layer and the base layer with an interposition of an insulating film, and wherein the diode region includes:

a cathode layer of a first conductivity type provided between the drift layer and the second main surface, an anode layer of a second conductivity type provided between the drift layer and the first main surface, a depth from the first main surface to a boundary between the anode layer and the drift layer being larger than a depth from the first main surface to a boundary between the carrier accumulation layer and the drift layer; and a plurality of diode trench electrodes provided in trenches penetrating the anode layer from the first main surface to reach the drift layer, wherein the accumulation layer directly contacts the anode layer.

* * * * *